US011695293B2

(12) United States Patent
Tikhonski et al.

(10) Patent No.: US 11,695,293 B2
(45) Date of Patent: Jul. 4, 2023

(54) POWER SYSTEM

(71) Applicant: LiTech Laboratories, LLC, Austin, TX (US)

(72) Inventors: Alexei Tikhonski, Austin, TX (US); Robert L. Myers, Austin, TX (US); James P. Novak, Austin, TX (US)

(73) Assignee: LiTech Laboratories, LLC, Austin, TX (US)

( * ) Notice: Subject to any disclaimer, the term of this patent is extended or adjusted under 35 U.S.C. 154(b) by 0 days.

(21) Appl. No.: 17/505,473

(22) Filed: Oct. 19, 2021

(65) Prior Publication Data

US 2022/0037910 A1    Feb. 3, 2022

Related U.S. Application Data

(63) Continuation-in-part of application No. 16/760,762, filed as application No. PCT/US2017/068301 on Dec. 22, 2017, now Pat. No. 11,171,507.

(51) Int. Cl.
*H02J 7/00* (2006.01)
*G05F 1/59* (2006.01)
(Continued)

(52) U.S. Cl.
CPC .. *H02J 7/007182* (2020.01); *G01R 19/16538* (2013.01); *G05F 1/59* (2013.01);
(Continued)

(58) Field of Classification Search
CPC ...... H02J 7/007182; H02J 7/0048; H02J 1/12; H02J 7/0029; H02J 7/0063; G01R 19/16538; G05F 1/59
See application file for complete search history.

(56) References Cited

U.S. PATENT DOCUMENTS 5,598,041 A   1/1997  Willis
5,764,032 A   6/1998  Moore
(Continued)

FOREIGN PATENT DOCUMENTS

CN   105429280   3/2016
CN   105591460   5/2016
(Continued)

OTHER PUBLICATIONS

Russian International Searching Authority; International Search Report & Written Opinion for PCT/US2017/068301; dated Aug. 23, 2008; 6 pages.

(Continued)

*Primary Examiner* — Jared Fureman
*Assistant Examiner* — Duc M Pham
(74) *Attorney, Agent, or Firm* — Jerry M. Keys; Matheson Keys & Kordzik PLLC

(57) ABSTRACT

A power system provides power from a power source to a load via a distribution bus, and includes a DC-DC converter coupled in parallel with a network of switching elements coupled between an output terminal of the power source and the distribution bus. A controller is configured to selectively activate or deactivate the DC-DC converter and each of the switching elements to enable the power source to power the load via the distribution bus. The switching elements may be transistors, and the diodes may be parasitic body diodes of the transistors. The power source may be a battery, such as a rechargeable battery. An output voltage level from the battery may be regulated by the controller as a function of operation of the DC-DC converter and a number of the activated or deactivated transistors.

18 Claims, 19 Drawing Sheets

(51) Int. Cl.
*H02J 1/12* (2006.01)
*G01R 19/165* (2006.01)

(52) U.S. Cl.
CPC .............. *H02J 1/12* (2013.01); *H02J 7/0029* (2013.01); *H02J 7/0048* (2020.01); *H02J 7/0063* (2013.01)

(56) References Cited

U.S. PATENT DOCUMENTS

| | | | |
|---|---|---|---|
| 7,038,522 | B2 | 5/2006 | Fauh |
| 7,893,560 | B2 | 2/2011 | Carter |
| 8,044,639 | B2 | 10/2011 | Tamegai |
| 9,065,277 | B1 | 6/2015 | Kim et al. |
| 9,490,662 | B2 | 11/2016 | Shinohara |
| 10,658,840 | B2 | 5/2020 | Humphrey |
| 2004/0263121 | A1 | 12/2004 | Breen et al. |
| 2004/0263123 | A1 | 12/2004 | Breen |
| 2008/0278116 | A1 | 11/2008 | Matsunaga |
| 2015/0008731 | A1* | 1/2015 | Takahashi .............. B60R 16/03 307/9.1 |
| 2017/0197565 | A1* | 7/2017 | Yoneyama ............. B60R 16/03 |
| 2018/0143263 | A1 | 5/2018 | Humphrey |
| 2021/0006076 | A1* | 1/2021 | Rentel .................. H02J 7/0024 |

FOREIGN PATENT DOCUMENTS

| | | |
|---|---|---|
| CN | 105790423 | 7/2016 |
| JP | H1023678 | 1/1998 |
| JP | 2004096857 | 3/2004 |
| JP | 2004297851 | 10/2004 |
| JP | 2005253220 | 9/2005 |
| JP | 2008283743 | 11/2008 |
| RU | 2487392 | 7/2013 |
| TW | I550987 | 9/2016 |
| WO | WO2016/085460 | 6/2016 |
| WO | WO2017/014720 | 1/2017 |

OTHER PUBLICATIONS

TX Instruments; bq76200 High Voltage Battery Pack Front-End Charge/Discharge High-Side NFET Driver Evaluation Module; User's Guide SLVU926—Jul. 2015; 21 pages; Texas Instruments, Inc; US.

TX Instruments; bq76200 High Voltage Battery Pack Front-End Charge/Discharge High-Side NFET Driver; Product Review; 22 pages; Sep. 2015; Texas Instruments, Inc; US.

Japanese Patent Office; Office Action for corresponding JP Serial No. 2020-534541; dated Aug. 30, 2021; 6 pages; Tokyo, JP.

Taiwan Patent Office; Office Action and Search report dated Aug. 20, 2021 for corresponding Taiwan Application No. 107144999; 4 pages; Taipei, TW.

Europen Patent Office; Extended European Search Report for corresponding EP 17935405; dated Oct. 5, 2020; 8 pages; Munich, DE.

* cited by examiner

TRUTH TABLE FOR THRESHOLD DETECTOR

| CONDITION | SIGNAL UCTE | SIGNAL LCTE | COMMENTS |
|---|---|---|---|
| 1 | 0 | 0 | $V_o$ BELOW UPPER CONTROL THRESHOLD AND ABOVE LOWER CONTROL THRESHOLD |
| 2 | 1 | 0 | $V_o$ ABOVE UPPER CONTROL THRESHOLD |
| 3 | 0 | 1 | $V_o$ BELOW LOWER CONTROL THRESHOLD |
| 4 | 1 | 1 | NOT ALLOWED, OR NOT POSSIBLE |

*TABLE 16a*  *FIG. 16A*

| CONDITION | SIGNAL $dV_o/dt$ POSITIVE | SIGNAL $dV_o/dt$ NEGATIVE | COMMENTS |
|---|---|---|---|
| a. | 0 | 0 | $V_o$ STEADY STATE. NEITHER RISING OR FALLING. $dV_o/dt = 0$ |
| b. | 1 | 0 | $V_o$ RISING, POSITIVE SLOPE. $dV_o/dt > 0$ |
| c. | 0 | 1 | $V_o$ FALLING, NEGATIVE SLOPE. $dV_o/dt < 0$ |
| d. | 1 | 1 | NOT ALLOWED, OR NOT POSSIBLE |

*TABLE 16b*  *FIG. 16B*

COMBINED TRUTH TABLE FOR THRESHOLD DETECTOR AND DIFFERENTIATOR ($dV_o/dt$) DETECTOR

| CONDITION | SIGNAL UCTE | SIGNAL LCTE | SIGNAL $dV_o/dt$ POSITIVE | SIGNAL $dV_o/dt$ NEGATIVE | IMPEDANCE ACTION REQUIRED |
|---|---|---|---|---|---|
| 1a. | 0 | 0 | 0 | 0 | NONE |
| 1b. | 0 | 0 | 1 | 0 | NONE |
| 1c. | 0 | 0 | 0 | 1 | NONE |
| 2a. | 1 | 0 | 0 | 0 | NONE |
| 2b. | 1 | 0 | 1 | 0 | INCREASE IMPEDANCE |
| 2c. | 1 | 0 | 0 | 1 | NONE |
| 3a. | 0 | 1 | 0 | 0 | NONE |
| 3b. | 0 | 1 | 1 | 0 | NONE |
| 3c. | 0 | 1 | 0 | 1 | DECREASE IMPEDANCE |

*TABLE 16c*  *FIG. 16C*

*FIG. 16*

| IMPEDANCE SEQUENCE (HIGH TO LOW) | FET ON/OFF STATE | | |
|---|---|---|---|
| | 110d | 110c | 110b |
| 0 (ALL FETS OFF) | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |
| BINARY COUNTING SEQUENCE | | | |

TABLE 17a  FIG. 17A

| IMPEDANCE SEQUENCE (HIGH TO LOW) | FET ON/OFF STATE | | |
|---|---|---|---|
| | 110d | 110c | 110b |
| 0 (ALL FETS OFF) | 0 | 0 | 0 |
| 1 | 0 | 0 | 1 |
| 2 | 0 | 1 | 1 |
| 3 | 1 | 1 | 1 |
| SEQUENTIAL COUNTING SEQUENCE | | | |

TABLE 17b  FIG. 17B

| IMPEDANCE SEQUENCE (HIGH TO LOW) | FET ON/OFF STATE | | | COUNTING SEQUENCE |
|---|---|---|---|---|
| | 110d | 110c | 110b | |
| 0 (ALL FETS OFF) | 0 | 0 | 0 | BINARY |
| 1 | 0 | 0 | 1 | |
| 2 | 0 | 1 | 0 | |
| 3 | 0 | 1 | 1 | |
| 4 | 1 | 1 | 1 | SEQUENTIAL |
| BINARY/SEQUENTIAL SEQUENCE | | | | |

TABLE 17c  FIG. 17C

POWER SYSTEM

This application is a continuation-in-part application of U.S. patent application Ser. No. 16/760,762 filed Apr. 30, 2020, which is a national phase application of International Application No. PCT/US2017/068301, filed Dec. 22, 2017, which are both hereby incorporated by reference herein.

TECHNICAL FIELD

The present disclosure relates in general to power supply technology, and in particular, to a system for monitoring battery cells and controlling their discharge when connected to an electrical distribution bus.

BACKGROUND INFORMATION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Modern information technology and telecommunication systems contain electrical distribution buses that operate at a wide variety of distribution bus voltages. For example, computer servers commonly distribute 12 volts ("V") to their internal subsystems such as memory, processor, storage, cooling fans, and I/O (such internal subsystems to which a distribution bus provides a supply voltage are referred to herein as a "load circuit," or simply a "load"). Wired telecommunications systems commonly use a 48 V distribution bus voltage level, and wireless telecommunications and cell site systems often use 24 V as their internal power distribution bus voltage level. Even though distribution bus voltage levels differ, all of the above-mentioned systems share several common characteristics in that these distribution buses may carry tens or even hundreds of Amperes ("A") of electrical current under normal operation, and generally have requirements that the voltages on these buses be regulated to ensure that a maximum voltage excursion on the bus be limited to a fixed value above or below a desired nominal value. A regulated distribution bus will have a specified voltage tolerance applied to its nominal value. For example, a 12 V distribution bus with a +/−10% tolerance will have an operational envelope ranging from a maximum level of 13.2 V down to a minimum level of 10.8 V.

Within the last ten years, battery systems have been developed that are optimized for delivering very high electrical currents for short durations. Battery systems typically include one or more battery cells (herein, the terms "battery" and "cell" may be used interchangeably). Because of their small size, these have become attractive in some equipment types for the purpose of replacing a traditional Uninterruptable Power Supply ("UPS") serving the role of a short-term electrical backup of equipment in the event of outages of AC main power. These high-power battery systems are unique in their capability to deliver a very high discharge current, but have a shortcoming of only being capable of slowly accepting a charging current. This ratio of discharge current to charge current can be as high as 30:1, or even 40:1, with technology that is currently commercially available.

High-power battery systems used today for short duration backup applications typically employ output regulators in the form of DC-DC converters capable of processing high energy (e.g., an output DC-DC converter) to match the output voltage of the battery system to the distribution bus voltage, and to prevent the backflow of current from the distribution bus into the batteries, which would result in unsafe charging currents and represent a safety hazard. In many of today's systems, a charging current is provided through a separate path from discharge current, and may be provided by a separate, low-power charging DC-DC converter. Thus, there exists an opportunity for cost reduction and electrical efficiency improvement if such a high power output DC-DC converter could be eliminated or replaced with a different scheme possessing higher electrical efficiency and lower cost, while allowing a battery system to be directly connected to the distribution bus through this improved scheme.

There exists today prior art for the direct connection of battery systems to electrical buses, almost all of which use either high-side or low-side Metal Oxide Semiconductor Field Effect Transistor ("MOSFET") pairs acting as switched elements (also referred to herein as simply "switches") for ON/OFF control of charge and discharge current. MOSFETs are commonly used in these applications because they contain, by nature of their fabrication process, a diode (i.e., a parasitic body diode), which allows current to flow in one direction through the MOSFET even when the MOSFET is switched OFF. This body diode represents a problem in many applications, but is actually utilized as an advantage in embodiments of the present disclosure.

Many of today's battery systems utilize two switches positioned back-to-back, each of which includes either a parasitic body diode in parallel with each switch or an external diode across the switch. The switch with the forward-facing diode (facing from the battery to the load) is considered the "Charge" switch (in its OFF state, it blocks any charging current), and the other switch is the "Discharge" switch (in its OFF state, it blocks any discharge current). This scheme works for low-power distribution buses where the following conditions are met: (1) total current capacity of the bus (either available on the bus or consumed by the load coupled to the bus) does not exceed either the safe charge or discharge currents of the battery, (2) the distribution bus voltage is controllable such that it can be raised sufficiently high when needed in order for the battery to receive a full charge after it becomes discharged, and (3) the allowable operating voltage of the load circuit ranges between or includes the minimum battery terminal voltage when the battery is fully discharged (i.e., 0% state of charge), and the maximum battery terminal voltage when the battery is fully charged (i.e., 100% state of charge). However, it is not practical to use this approach when the voltage tolerance required by load circuits coupled to the distribution bus requires tight regulation such that the voltage supplied to the distribution bus must remain below the fully charged voltage of the battery; nor can it be used when the current normally available from the bus exceeds a safe level of charging current for the battery.

The industry standard for direct connection of single or multi-cell battery systems to distribution buses is seen in low-power systems such as implemented for notebook and tablet computers, as well as cell phones. These devices use the previously mentioned "back-to-back" configuration of single transistor switches for charge and discharge control. FIG. 2 illustrates a "high-side" configuration of switches, where the switches $Q_1$ and $Q_2$ (e.g., MOSFETs) are arranged such that the switches are connected to the high voltage side (+side) of the battery. The switches $Q_1$ and $Q_2$ are connected so that the battery can be charged and discharged depending on which of the two switches is switched ON. A controller is coupled to each of the switches and exerts control over which of the switches is switched ON, under what conditions, and for what duration. Charge and discharge control is thus exerted by the controller. The controller may allow or disallow charge or discharge based on battery state of health, level of charge, instantaneous capacity, voltage, current, temperature, or any other parameters that the designer may select. The combination of the switches, their parasitic body diodes, and the controller allow for charge control (prohibiting charge flow from the distribution bus to the battery), discharge control (prohibiting charge flow from the battery to the distribution bus), or complete electrical isolation of the battery terminals from the distribution bus (prohibiting charge flow in either direction).

This dual switch control scheme works in many battery applications where the allowable charge current, discharge current, and available bus currents are close in magnitude, or where the allowable charge current is considerably higher than the available bus current. Laptop computer batteries have a typical design point where the charge rate is approximately equal to the discharge rate, e.g., near 1C (i.e., one times the nominal battery capacity, C). Portable phone batteries can be designed to have higher charge rates (e.g., up to 4C), but typically have very low discharge rates. This allows phones to be charged quickly while at the same time having a long operational life on a single charge. At these low charge and discharge rates, the parasitic body diodes of the switches have adequate thermal and power capabilities to pass the necessary charge and discharge currents with minimal temperature rise and power loss.

However, there are an increasing number of real-world examples of systems possessing battery charge-discharge asymmetry where the allowable discharge rate far exceeds the allowable charge rate. For example, batteries serving electrical backup duty are commonly designed for charge times of 60-90 minutes, with high-rate discharge times that can fully deplete the batteries in 60-90 seconds. This very large disparity between normal charge and normal discharge currents (i.e., a large charge-discharge current asymmetry) makes the dual-switch control scheme of FIG. 2 impractical. Specifically, the body diode seen in the Charge Control Switch $Q_1$ is completely unsuitable to carry the discharge current that it would see if such a scheme were used, as its voltage drop and power dissipation would adversely affect the operation of the system. Additionally, in the example of a tightly regulated +12 V distribution bus with a lithium-ion battery as the energy storage device, the battery selected for such an application would need to be as close as possible to +12 V (e.g., 3 or 4 series-connected cells charged to 4.0 V per cell). As can be seen by one of ordinary skill in the art, it would not be possible to fully charge this battery from a +12 V source through an isolating diode possessing poor forward voltage characteristics (such as usually seen in the parasitic body diodes of conventional MOSFETs).

In addition to the isolation switches previously described, regulating systems have been designed for controlling the electrical output when converting battery voltage from one voltage level to another to safe connection to a power bus. For example, a linear regulator can be used to provide a uniform voltage output at a specific value or set point. Referring to FIG. 3, there is illustrated a feedback circuit that includes an operational amplifier ("OPAMP") that drives a series-pass element (e.g., a transistor with a diode in parallel). In such regulation systems, the circuit of FIG. 3 essentially replaces the Discharge Control Switch $Q_2$ of FIG. 2 to provide a regulated voltage output at the load until a crossover point where the minimum voltage drop across the series-pass element creates a voltage drop between the input to the linear regulator and its output (i.e., between the battery terminal and the load terminal) sufficient to bring the voltage at the load terminal down to within the specified operating voltage threshold (e.g., a minimally acceptable operating voltage level) of the load circuit.

Such a linear regulator may satisfactorily work when implemented for low-power devices. However, there are many deficiencies that arise as the power levels increase. First is that the series-pass element is operated in its linear mode, where the voltage difference between input and output voltages is imposed on the series-pass element, which in the case of high currents creates a very high-power loss and V*I based heat generation. This generated heat must be transferred to the environment or otherwise removed from the device, otherwise this heat will concentrate inside the series-pass element package, and even high-powered transistors will quickly overheat and fail. A package that can handle the heat generated from this power loss would require a very large physical package with a direct-mount heatsink and significant airflow to cool the device. Most high-power battery systems have physical space limitations and manufacturing constraints that discourage the use of this type of transistor packaging. Moreover, it is difficult to find a surface mount transistor ("SMT") capable of dissipating enough heat through its printed circuit board ("PCB") contacts to be practical.

Switching regulators are also used to convert battery voltage to a fixed bus voltage, as they can be much more electrically efficient due to their mode of operation. Generally, a step-down or "buck" converter requires an input voltage higher than its output voltage for operation, and is incapable of creating an output voltage equal to or greater than its input voltage. A typical input-output voltage relationship of a buck converter is shown in FIG. 4. This requires a series-connected battery stack with a higher series cell count to raise the input voltage to the converter to the required level necessary to achieve high efficiency and a manageable switching duty cycle. However, such a higher cell count can increase cost, circuit complexity, total circuit packaging volume, and battery management system ("BMS") component count and complexity. An alternative is shown in FIG. 5, where a DC-DC converter is implemented as a "buck-boost" converter, which is capable of creating a constant output voltage regardless of whether the input voltage is lower than, equal to, or higher than the constant output voltage, with recognition that if the input voltage drops too low, the converter operating parameters, such as input current, may grow too large for continued safe operation. For this reason, most buck-boost converters include an input undervoltage protection limit, or "UV Shutdown" limit, to prevent damage to the converter. Buck-Boost converters allow lower series cell counts than would be achievable with a buck converter, but integrated circuits that form the heart of the control circuit for the buck-boost converter are more difficult to find and generally more expensive than control integrated circuits ("ICs") for buck converters. The typical input-output voltage relationship of a buck-boost converter is shown in FIG. 5. It should be noted that no matter which DC-DC configuration is used in the current state of the art configuration—linear, switching buck, or switching buck-boost—the DC-DC converter must be designed both electrically and thermally to handle the maximum output power of the battery system. For example, a battery system rated for 1500 Watts of output power would require a DC-DC converter designed to handle the full 1500 Watts that the battery can deliver. This results in large and expensive DC-DC converters that must be coupled between the battery and the load circuits. This is depicted in FIG. 6, showing the DC-DC converter placed between the battery (+) terminal and the output voltage terminal $V_o$. Since all power that is delivered from the battery to the output voltage terminal $V_o$ must be processed through the DC-DC converter, the DC-DC converter must be sized to safely handle the maximum power expected to be delivered.

BRIEF DESCRIPTION OF THE DRAWINGS

FIGS. 16A, 16B and 16C illustrate a set of truth tables implemented in the non-limiting example of the state determination elements used in embodiments of the present disclosure, showing output signal levels from the control elements based on differing states of the input signal, and a truth table defining which combination of output signal levels will trigger a control action.

FIGS. 17A, 17B and 17C illustrate a set of tables demonstrating several non-limiting sequences of ON/OFF controls that result in a stepwise increase or decrease of total impedance of the network of FET/resistor pairs illustrated in FIG. 1.

DETAILED DESCRIPTION

It will be understood that particular embodiments described herein are shown by way of illustration and not as limitations of embodiments of the disclosure. The principal features of this disclosure can be employed in various embodiments without departing from the scope of the disclosure.

Per convention, electrical current in circuit diagrams and equations is referred to with the symbol i, and is expressed with the units of Amperes, or ("A").

Figure 7:
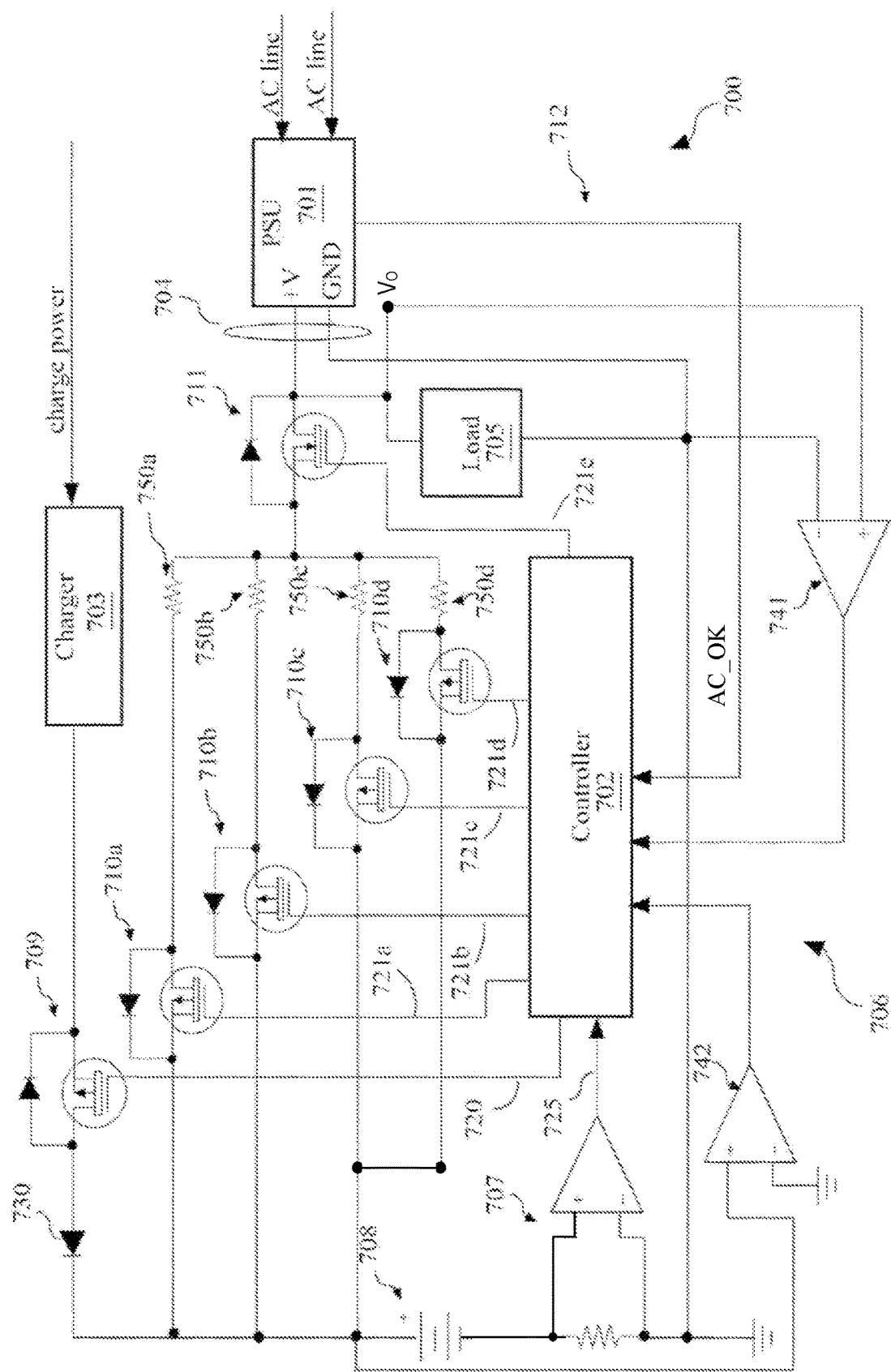
FIG. 7 illustrates a circuit block diagram of a system disclosed within U.S. Published Patent Application No. 2020/0350779.

As an alternative to linear or switching regulators, systems as disclosed within U.S. Published Patent Application No. 2020/0350779 provide a set of individually controlled switches that connect a power source (e.g., a battery terminal voltage) to an output (e.g., a distribution bus) to which may be connected a load circuit (e.g., see FIG. 7). When MOSFETs are utilized as the switches, the MOSFETs may be operated in a predetermined (e.g., programmed) manner to take advantage of inherent forward voltage drops of the body diodes of the MOSFETs and/or an external resistance (e.g., a resistive element) coupled in series with each MOSFET to regulate the delivery of an output voltage and current from a battery. Such circuitry may be configured to replace a battery discharge DC-DC converter, withstand high discharge currents, and/or operate more efficiently in many of the operating modes as compared to linear or switching regulators operating at high power.

To understand how a parallel connection of discharge control switches can control application of a battery discharge voltage as well as provide an equivalent output voltage regulation, characteristic operations of an exemplary battery are now discussed.

Rechargeable batteries, such as Lithium-ion ("Li-ion") based rechargeable batteries, can be constructed with different internal materials and specific chemical compositions that define the operational voltage range, the maximum discharge current, the internal impedance, and the specific capacity of each battery cell. Each of these parameters defines a family of discharge voltage versus discharge current curves (also referred to as "V-I curves") unique to each type of cell.

Batteries may be constructed with a certain chemical energy capacity as determined by the finite weight or volume of active chemical materials contained within each cell of the battery. The capacity is measured by discharge at a given current and time measured until a certain minimum voltage is achieved. The capacity is typically reported in milli-amp-hours ("mAh") or amp-hours ("Ah"). This capacity is represented herein by the letter "C" corresponding to the continuous current available from the battery for 1 hour that results in the battery discharging from a state of 100% state of charge ("SOC") (i.e., fully charged to a maximum allowed voltage) to a state of 0% SOC (i.e., fully discharged to a minimum allowed voltage). For any given discharge current, the terminal voltage of the battery will drop in accordance with its SOC. The SOC will decrement from 100% to 0% as the chemical capacity of the battery is depleted.

Figure 8:
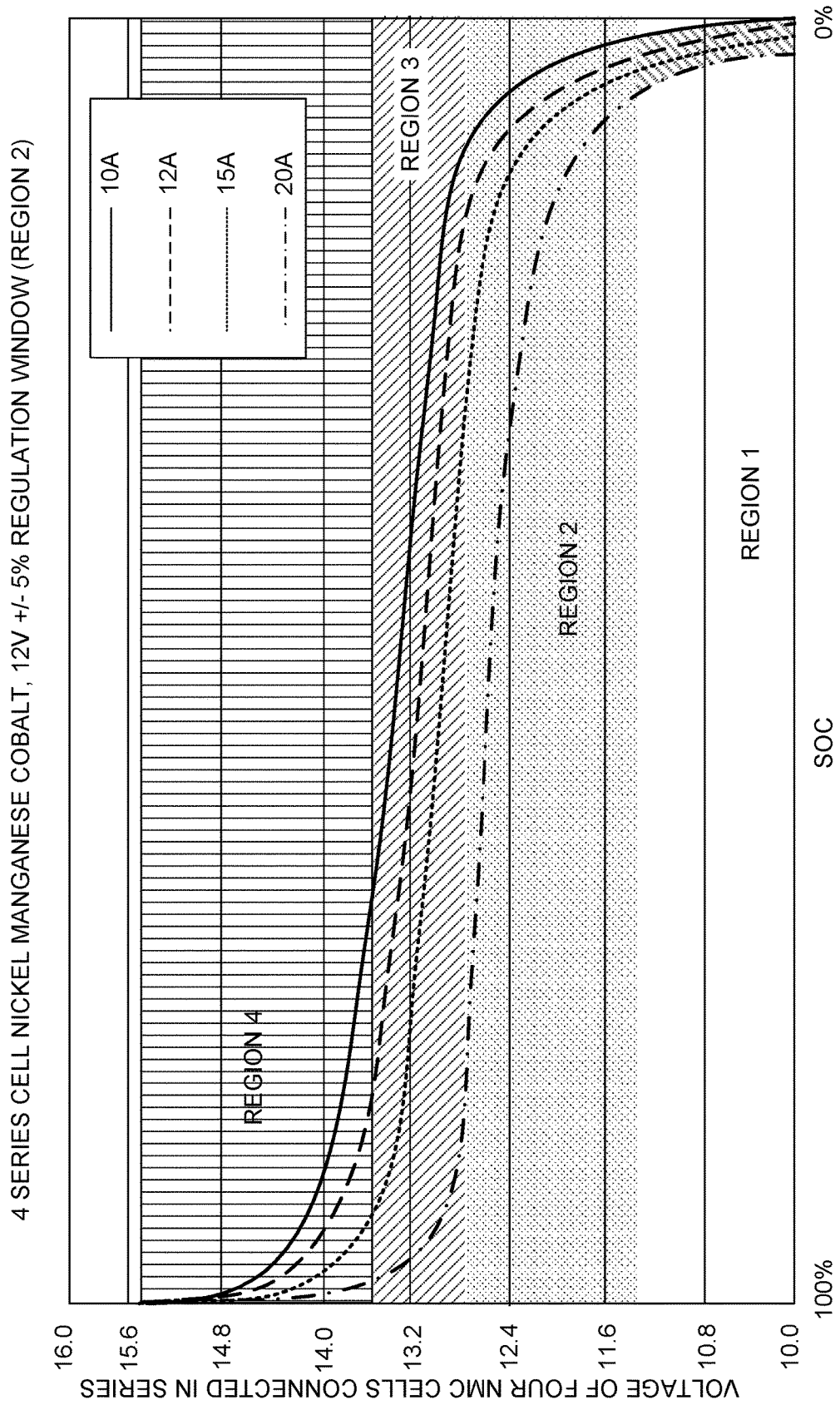
FIG. 8 illustrates a plot of a family of voltage curves versus state of charge ("SOC") at different possible load currents for an exemplary lithium-ion rechargeable battery where four cells are connected in series and the cells are composed of the Lithium Manganese Cobalt chemistry.

FIG. 8 illustrates a plot of a family of voltage curves versus SOC at different possible load currents (i.e., V-I curves) for an exemplary battery of four series-connected lithium-ion rechargeable cells, using Nickel Manganese Cobalt ("NMC") chemistry. These curves define an exemplary operating envelope within which the battery voltage may operate for various conditions of battery current and SOC. More specifically, the plot in FIG. 8 represents voltage curves versus SOC at different load currents wherein the battery possesses a capacity of 1 Ah during current demands of 10 A, 12 A, 15 A, and 20 A.

As can be readily seen, the terminal voltage of a battery at any given SOC will shift lower as a function of an increase in current demand. The distances between the curves on the voltage scale as current demand increases are due to the battery cell's internal resistance or impedance. The higher the internal impedance, the lower the battery terminal voltage will be for a given applied discharge current present at the battery output terminals. Thus, the battery terminal voltage at a given SOC is dependent not only on SOC, but on the discharge current demand as well, and exists within the operating envelope defined by the characteristic curves.

As can be appreciated from the illustration of FIG. 8, the output (discharge) voltages of typical batteries are not constant, but variable with discharge current present at the battery output terminals and SOC, and thus a typical battery by itself does not possess an inherent capability to regulate or maintain its discharge voltage within a specific voltage range over the time it takes for the stored energy to be depleted from the battery or with changing load currents. However, as previously described herein, it is very common in power systems that any sources feeding power to the distribution bus be required to regulate the voltages supplied to the distribution bus to ensure that a maximum and minimum voltage excursion on the distribution bus be limited to a specified value above or below a desired nominal value, i.e., the allowable range of voltages that can be tolerated by a load coupled to the distribution bus to ensure a specified (e.g., error-free) operation (herein referred to as the "specified load voltage tolerance range"). This is one of the reasons why voltage regulators or DC-DC converters, such as those previously described, have been implemented in order to maintain the output voltage supplied (e.g., by a battery or other source) to a distribution bus within such a specified load voltage tolerance range.

Referring again to FIG. 8, for purposes of describing embodiments of the present disclosure, the operating envelope for a discharging battery with respect to a particular load may be divided into several regions, and in this example, Regions 1, 2, 3, and 4. The Region 1 area defines operating points on the battery terminal voltage versus SOC curves that lie below the specified load voltage tolerance range of the load. The Region 2 area defines operating points on the battery terminal voltage versus SOC curves that lie within the specified load voltage tolerance range. The Region 3 area defines certain operating points on the battery terminal voltage versus SOC curves that lie above the specified load voltage tolerance range. As will be further described herein, while operating within this Region 3 area, embodiments of the present disclosure are configured to provide a finer control of the output voltage provided to a load utilizing a N FET/resistor pair network (e.g., see FIG. 9). In accordance with exemplary embodiments of the present disclosure, the top boundary of the Region 3 area lies above the top boundary of the Region 2 area by less than about 5% of the nominal value of the load voltage (e.g., 0.6 V in the case of a 12 V nominal load voltage, 1.2 V in the case of a 24 V nominal load voltage, etc.). The Region 4 area defines operating points on the battery terminal voltage versus SOC curves that lie above the Region 3 area. The operating envelope for the exemplary battery described with respect to FIG. 10 is also divided into similar regions.

FIG. 7 illustrates a circuit block diagram of a system 700 as disclosed within U.S. Published Patent Application No. 2020/0350779. The system 700 employs a battery system 706 configured to selectively couple an output terminal of a battery 708 to a distribution bus 704 through a defined switching configuration that includes a network of N (where N≥2) parallel-connected discharge switches 710a . . . 710d (e.g., MOSFETs), each coupled in series with a resistor 750a . . . 750d to form a network of N FET/resistor pairs.

The system 700 may be utilized for batteries that have battery terminal voltages that extend above the specified load voltage tolerance range (e.g., as required by a load 705; for example, see the Region 2 area shown in the example of FIG. 8). As discussed herein, typical batteries have terminal voltages at certain operating points that will lie outside such a narrowly specified load voltage tolerance range required by many loads. Therefore, the system 700 can be employed to regulate the supplied voltage to the distribution bus 704 substantially within this specified load voltage tolerance range of 12 V+/−5% as shown in the Region 2 area of FIG. 8, even though the voltage present at the terminals of the battery 708 is above this Region 2 range. The voltage present at the terminals of the battery 708 may be configured to lie above the specified load voltage tolerance range (for example, see the Region 3 and Region 4 areas shown in the example of FIG. 8) of the distribution bus 704 at some SOC and battery current conditions, while the voltage supplied to the load 705 is adjusted to substantially match the specified load voltage tolerance range of the distribution bus 704 under other SOC or battery current conditions such as the Region 2 area.

Each of the resistors 750a . . . 750d may be configured with a different resistive value, and may be configured such that the resistive value of each resistor in the series 750a . . . 750d is lower than the previous resistor in the series (e.g., the resistor 750b has a resistive value lower than the resistor 750a, the resistor 750c has a resistive value lower than the resistor 750b, etc.). The FET/resistor pairs may be connected in parallel between the battery terminal and the distribution bus 704 through another switching element (e.g., a MOSFET) 711 that prevents charging of the battery directly from the distribution bus 704, and where each of the N FETs 710a . . . 710d and its paired resistor, as well as the FET 711, is independently controlled by the controller 702 via the control lines 721a . . . 721e. However, embodiments may be implemented with one or more of the resistors 750a . . . 750d having substantially equivalent resistive values.

The number, N, of parallel-connected discharge control FET/resistor pairs can range from two to any number that can be practically controlled by the controller 702. The number, N, of discharge control FET/resistor pairs may be generally determined by a number of factors such as the minimum and maximum voltages available from the battery 708, the expected range of minimum and maximum output currents, and the required minimum and maximum output voltage range (e.g., as determined by a specified load voltage tolerance range (for example, see the Region 2 area shown in the example of FIG. 8)).

The battery 708 may be coupled to the distribution bus 704 by activating (e.g., switching ON) by the controller 702 one or more of the N FETs 710a . . . 710d in a predetermined manner (e.g., sequential, binary counting sequence, or any other sequence), such as beginning with the FET 710a, which may be paired with the highest resistive value resistor 750a. Upon switching ON of the FET 710a, current will commence flowing to the load 705, and the terminal voltage of the battery 708 will begin to drop in accordance with the battery impedance characteristic curves (e.g., see FIG. 8 and FIG. 10). If the current supplied to the load 705 through the series combination of the FET/resistor pair 710a/750a is sufficiently high, the voltage drop across the series combination of the FET/resistor pair 710a/750a will increase until the voltage supplied to the load 705 drops to a predetermined threshold, which may be set (e.g., within the controller 702) in accordance with a minimum regulation point specification of the load 705 (e.g., a lower limit of a specified load voltage tolerance range). As this threshold is reached and sensed by the controller 702 through the output voltage sensor 741, the controller 702 may be configured to switch OFF the FET/resistor pair 710a/750a, and switch ON the FET paired with the resistor 750b, which may have the next highest resistive value among the series of resistors 750a . . . 750d. The resistor 750b in series with the FET 710b can be configured to have a resistive value significantly smaller than that of the resistor 750a, and thus the voltage drop across the series combination of the FET 710b and the resistor 750b will be lower than that across the series combination of the FET 710a and the resistor 750a. An effect of this will be to increase the output voltage supplied to the load 705 above the previously noted threshold pertaining to the minimum regulation point specification of the load 705 (e.g., a lower limit of a specified load voltage tolerance range), and thus keep the output voltage supplied to the load 705 above this minimum predetermined threshold. In this way, the output voltage supplied to the load 705 can be maintained by the controller 702 within the application regulation window (e.g., the specified load voltage tolerance range (for example, see the Region 2 area shown in the example of FIG. 8)) under changing battery terminal voltages and load currents, as sensed by the controller 702 via the battery voltage sensor 742, the output voltage sensor 741, and the current sensor 707, by the controller 702 selectively activating the N FETs 710a . . . 710d (e.g., in an upward binary counting sequence or other suitable sequence) to increase the voltage supplied to the load 705, or selectively deactivating the N FETs 710a . . . 710d (e.g., in a downward binary counting sequence) to decrease the voltage supplied to the load 705, where the FET 710a is associated with the least significant bit of the binary sequential counter, and the FET 710d (or higher) is associated with the most significant bit.

Figure 9:
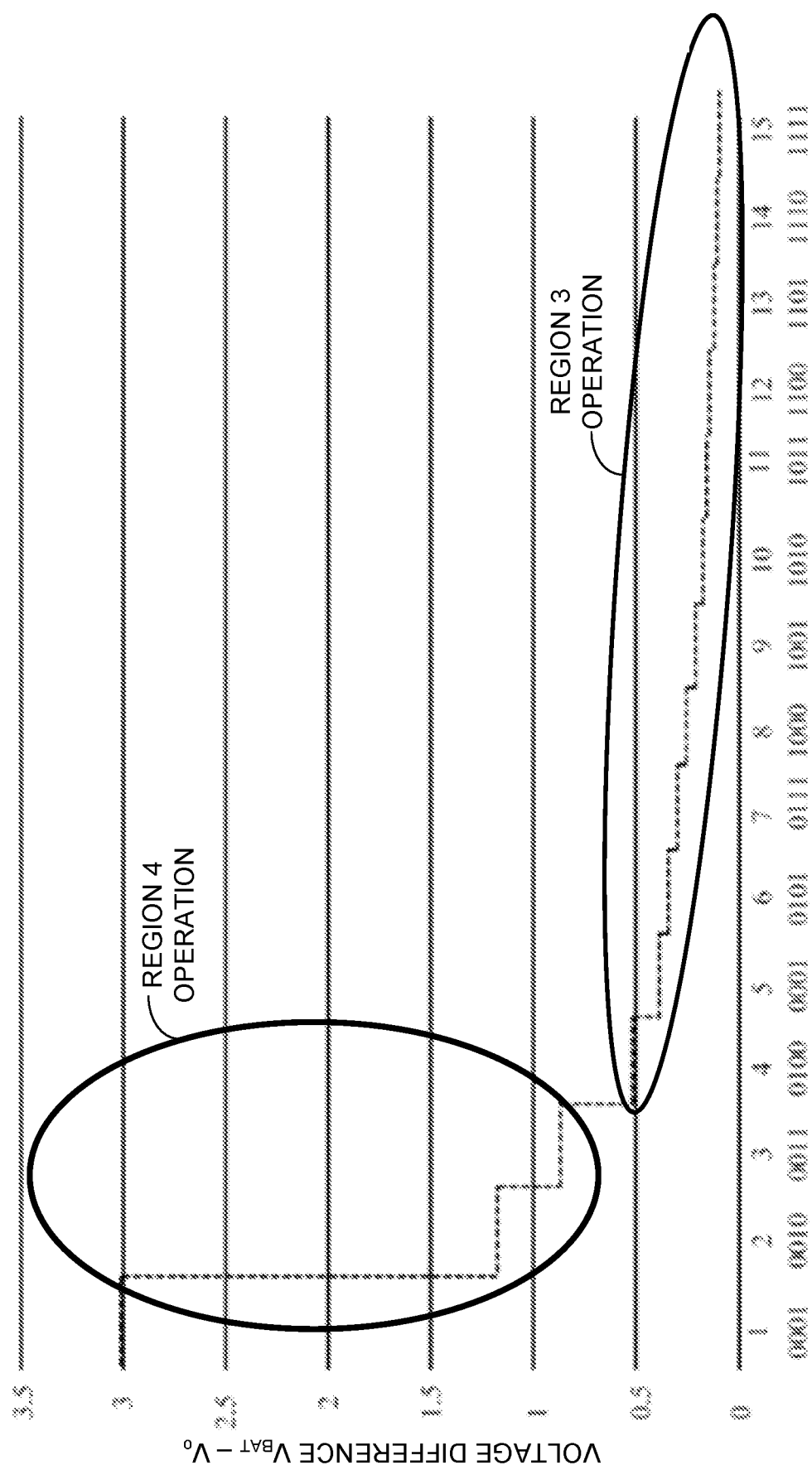
FIG. 9 illustrates a non-limiting representation of control steps using a binary sequencing scheme available in the system disclosed within U.S. Published Patent Application No. 2020/0350779.
Figure 10:
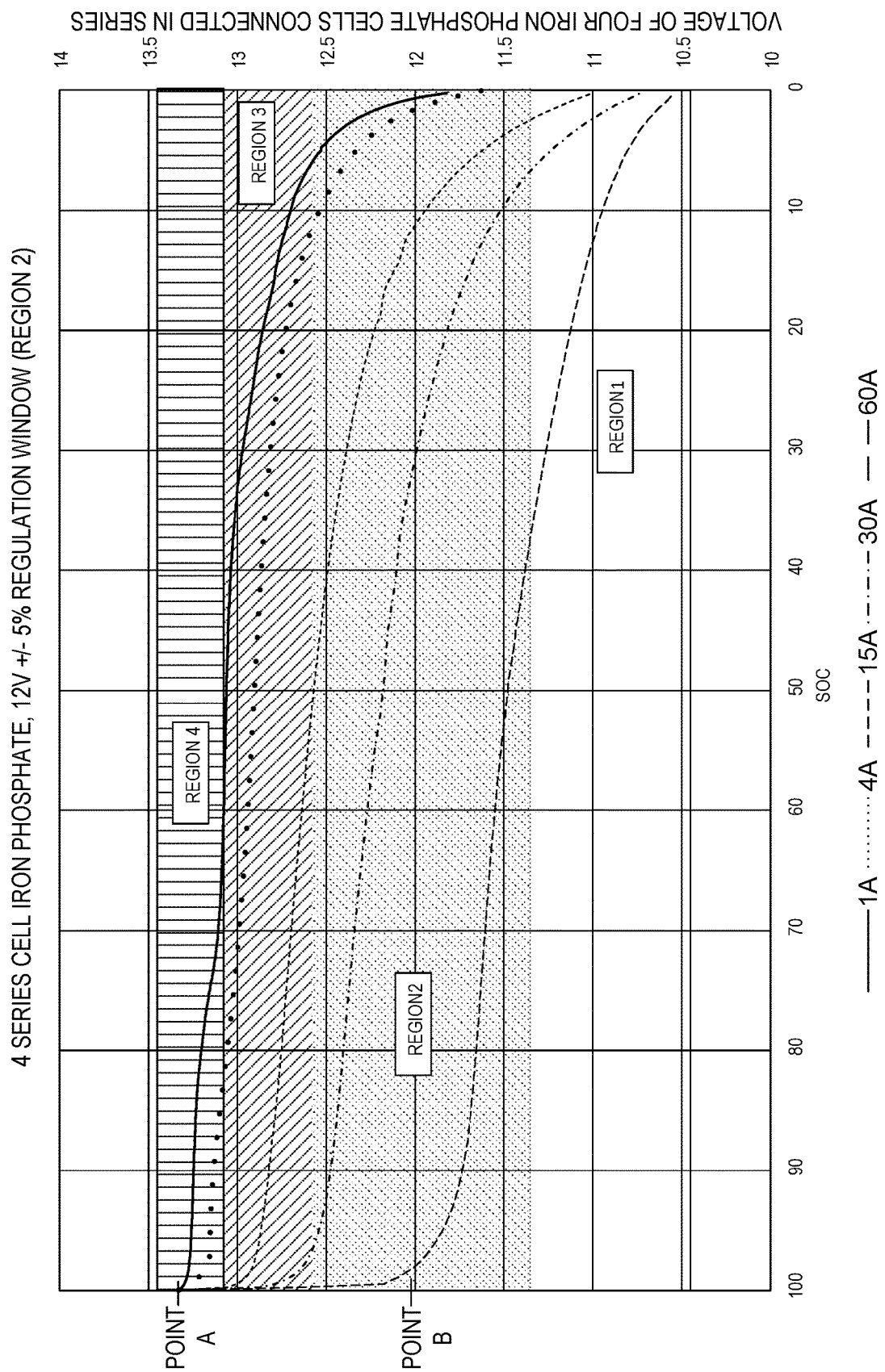
FIG. 10 illustrates a plot of a family of voltage curves versus state of charge ("SOC") at different possible load currents for an exemplary lithium-ion rechargeable battery where four cells are connected in series and the cells are composed of the Lithium Iron Phosphate ("LFP") chemistry.

A non-limiting example of a regulating scheme that may be implemented within the controller 702 is depicted in FIG. 9, which shows a total voltage drop across the parallel-connected FET/resistor pairs as a function of a binary counting sequence for selective activation by the controller 702 of the N FETs 710a . . . 710d. As can be seen, the voltage drop across the FET/resistor pair network may be controlled in $N^2$ discrete steps (e.g., 16 when N=4) to range from essentially 0 V to some desired maximum voltage (in this example, approximately 3.0 V). Due to its placement in the battery system 706 between the output terminal of the battery 708 and the input terminal $V_o$ of the load 705, the load 705 sees its input voltage to be the terminal voltage of the battery 708 minus the voltage drop across the FET/resistor pair network. By this technique, regulation of the voltage supplied to the load 705 (e.g., substantially within a specified load voltage tolerance range) can be achieved and maintained through switching ON/OFF of the N FETs 710a . . . 710d by the controller 702 to adjust the impedance (i.e., and consequently, the voltage drop) across the FET/resistor pair network.

Such a network of N parallel discharge switching elements (i.e., the N FET/resistor pairs) can be configured to operate (e.g., in response to instructions received from the controller 702) as a high current digital-to-analog converter where the source voltage (i.e., from the battery 708) is not constant over time (e.g., see FIG. 8), but varies with load current and SOC. In this configuration, information from the voltage sensors 741, 742 and the current sensor 707 may be utilized by the controller 702 to compensate for variations in both input and output voltages (i.e., the battery 708 and the load 705).

The resulting system 700 is thus configured as a network of N fixed impedance elements (i.e., the N FETs 710a . . . 710d and associated resistors 750a . . . 750d), which can be switched in and out of the network by the controller 702 to compensate for changes in voltages on the input (i.e., the battery 708) and the output (i.e., the load 705). Varying the resistive values of the resistors 750a . . . 750d will define the individual element impedances. Each FET/resistor pair can be configured with a specific voltage drop at a predetermined applied current. As a result, the system 700 can be configured to control a network of elements defining a variable, controllable impedance between the battery 708 and the load 705. As the voltage of the load 705 increases, the network is adjusted by the controller 702 such that the total impedance is increased and the voltage supplied to the load 705 is decreased. As the voltage of the battery 708 decreases, the network is reconfigured by the controller 702 such that the total impedance is reduced and thus the voltage across the network is also reduced, serving to maintain the voltage supplied to the load 705 within a desired range (e.g., substantially within a specified load voltage tolerance range). The compensating voltage drop across the network, which is subtracted from the battery voltage, can then be controlled by the controller 702 using any number of different control techniques such that a resulting voltage supplied to the load 705 is controlled through sequencing of the various N FET/resistor pairs in the system 700 to provide high resolution voltage matching whenever the battery operating point exists (e.g., drifts for whatever reason) within the Regions 1, 2, or 3 operating ranges (e.g., as shown in FIG. 8).

Because the system 700 can only reduce the supplied battery voltage to some lower voltage required by the load 705, there will be some areas of the battery characteristic curves that are unusable, for example, corresponding to the Region 1 area as shown in FIG. 8. Any energy contained in the Region 1 area cannot be used by the system 700 and is essentially stranded. While the Region 1 area contains only a small portion of the total battery energy represented by this family of V-I curves, other battery chemical types and configurations may strand significantly more energy in the unusable Region 1 area (e.g., see FIG. 10).

Figure 1:
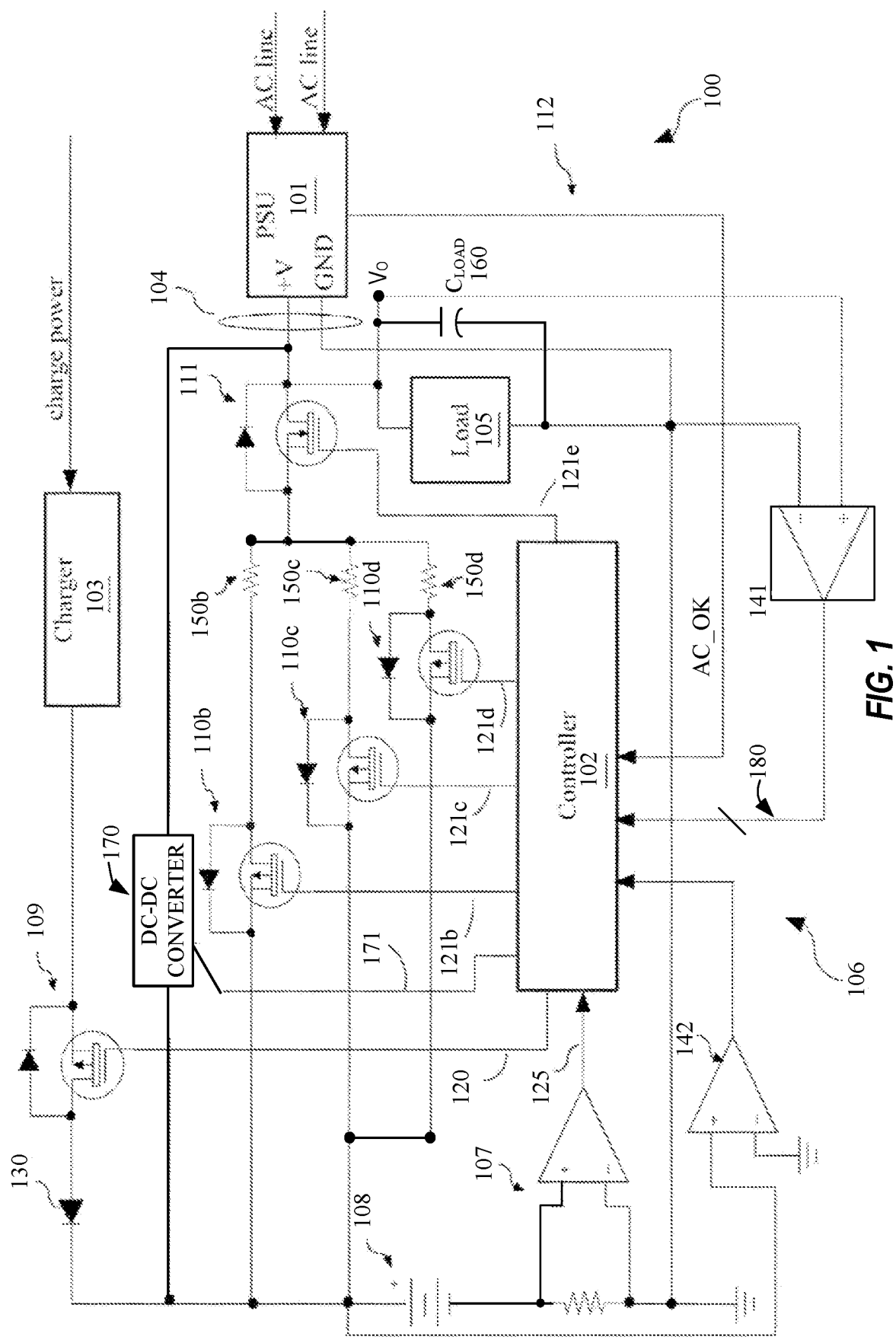
FIG. 1 illustrates a circuit block diagram configured in accordance with embodiments of the present disclosure.
Figure 2:
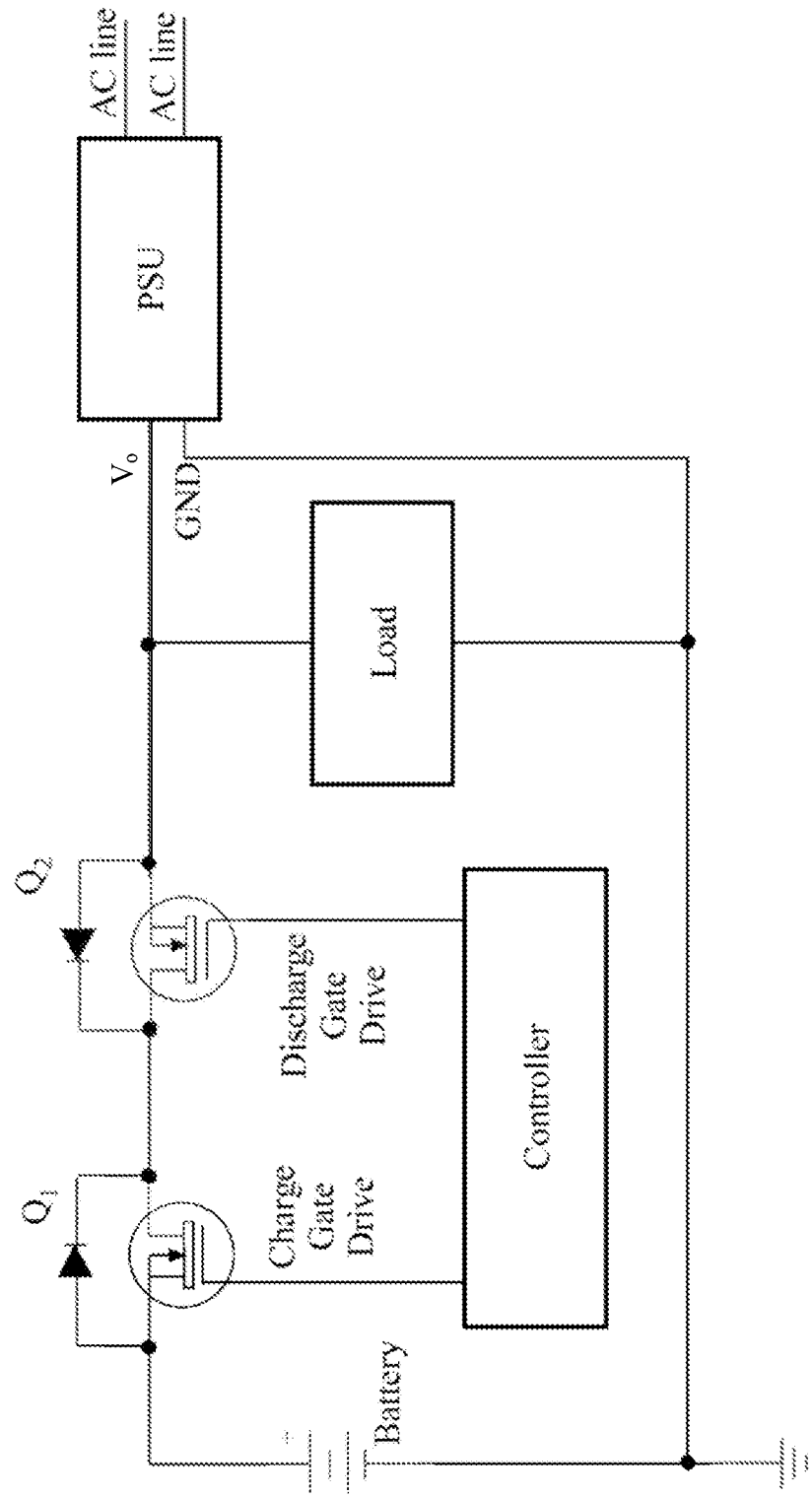
FIG. 2 illustrates a system representing a prior art example of a charge and discharge control system for a battery coupled to a power supply and load.
Figure 3:
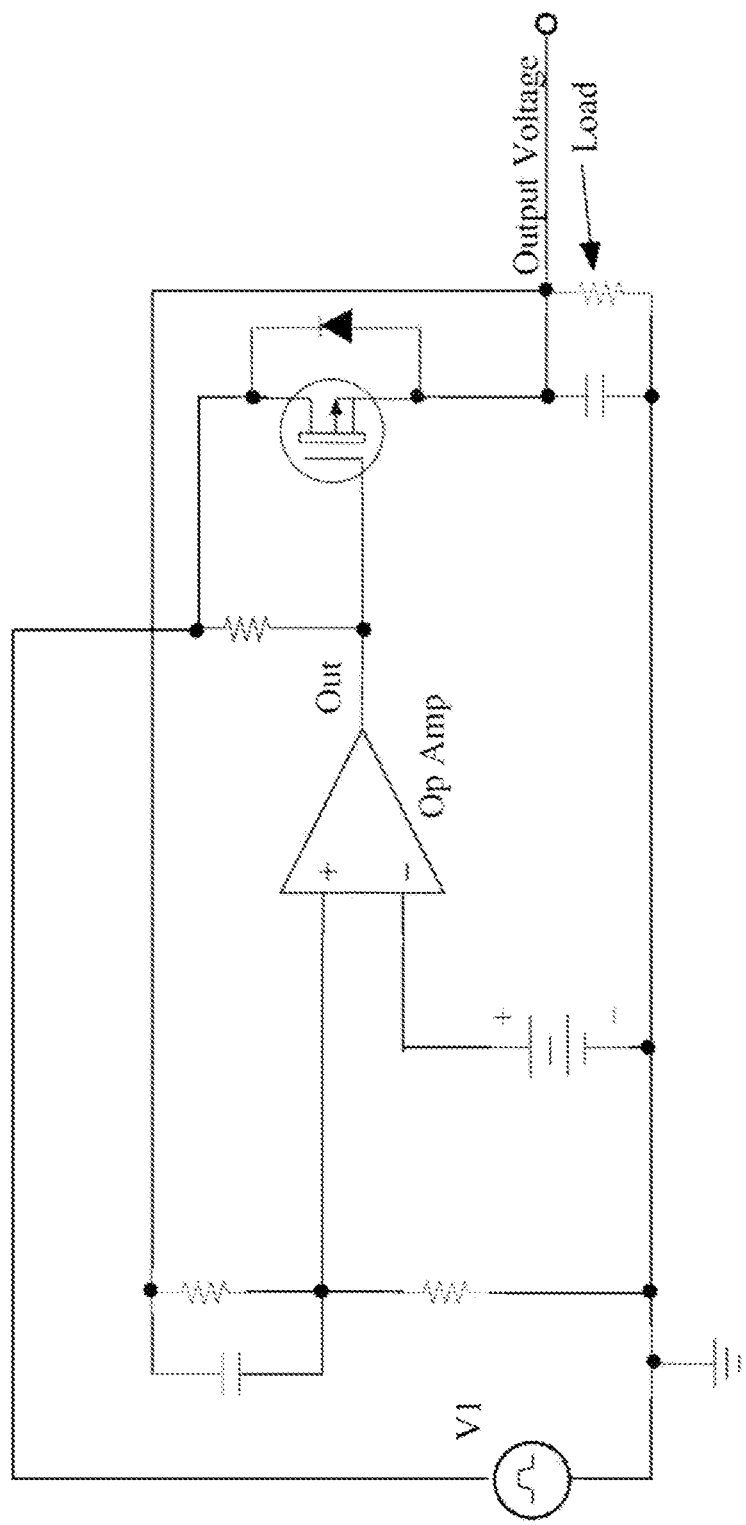
FIG. 3 illustrates a prior art implementation of a linear regulator DC-DC converter for regulating the output of a battery connected to a load.

FIG. 1 illustrates a circuit block diagram of a system 100 configured in accordance with embodiments of the present disclosure. The system 100 may be configured to provide power to a load via a distribution bus from a secondary power source when there is a failure of a primary power source. Though embodiments of the present disclosure are not limited to such a configuration, the primary power source may be a power supply unit coupled to an AC power source, while the secondary power source may be a battery.

In the non-limiting exemplary embodiment illustrated with respect to FIG. 1, the system 100 employs a battery system 106 that is configured to selectively couple, under control of the controller 102, an output terminal of a battery 108 to a distribution bus 104 through a DC-DC converter 170 and a switching configuration that includes a network of N (where N≥1) parallel-connected discharge switches 110b . . . 110d (e.g., MOSFETs), each coupled in series with a resistor 150b . . . 150d to form a network of N FET/resistor pairs (also referred to herein as the "N FET/resistor pair network").

Each of the resistors 150b . . . 150d may be configured with a different resistive value, and may be configured such that the resistive value of each resistor in the series 150b . . . 150d is lower than the previous resistor in the series (e.g., the resistor 150c has a resistive value lower than the resistor 150b, the resistor 150d has a resistive value lower than the resistor 150c, etc.). However, embodiments may be implemented with one or more of the resistors 150b . . . 150d having substantially equivalent resistive values.

The N FET/resistor pairs may be connected in parallel and be similarly interposed between the positive terminal of the battery 108 and the distribution bus 104 through another switching element (e.g., a MOSFET) 111, which may be implemented to prevent charging of the battery 108 directly from the distribution bus 104, and where each of the N FETs 110b . . . 110d, as well as the FET 111, is selectively and independently controlled by the controller 102 via the control lines 121b . . . 121e.

The number, N, of parallel-connected discharge control FET/resistor pairs can range from one to any number that can be practically controlled by the controller 102, and may be generally determined by one or more factors such as the minimum and maximum voltages available from the battery 108, the expected range of minimum and maximum output currents, and the required minimum and maximum output voltage range (e.g., as determined by a specified load voltage tolerance range (for example, see the Region 2 area shown in the example of FIG. 8)). Changes in the terminal voltages and load currents of the battery 108 may be sensed by the controller 102 via the battery voltage sensor 142 and the current sensor 107.

The system 100 may be utilized for batteries that have battery terminal voltages at valid operating points that extend above the specified load voltage tolerance range (e.g., as required by a load 105; for example, see the Region 2 area shown in the example of FIG. 8 as compared to the entire range of battery operating points including those that are outside the Region 2 area such as those contained in Regions 1, 3, and 4). As discussed herein, typical batteries or series-connected batteries have terminal voltages at certain operating points that lie outside what is in almost every instance a narrower and tightly limited specified load voltage tolerance range required by most loads. Therefore, the system 100 can be employed to regulate the supplied battery voltage substantially within this specified load voltage tolerance range. The voltage of the battery 108 may be configured to lie above the specified load voltage tolerance range (for example, see the Region 3 and Region 4 areas shown in the example of FIG. 8) of the distribution bus 104 at some SOC and battery current conditions, and substantially match the specified load voltage tolerance range (see the Region 2 area shown in the example of FIG. 8) of the distribution bus 104 under other SOC or battery current conditions.

Operation of the system 100 is similar to that of the system 700 with a DC-DC converter 170 implemented according to the $V_{IN}$ versus $V_{OUT}$ and output current limit characteristics (e.g., see FIG. 11) of the type of DC-DC converter 170 implemented within the system 100, and which may be configured to be able to handle the delivery of a current to the load 105 when the load 105 is demanding low current (i.e., less than approximately 25% of the maximum current that might be required by the load 105) and the battery 108 is operating at high a state of charge (e.g., SOC values greater than approximately 70%), for example, corresponding to operation of the system 100 in the Region 4 area as shown in FIG. 8 or FIG. 10.

Figure 4:
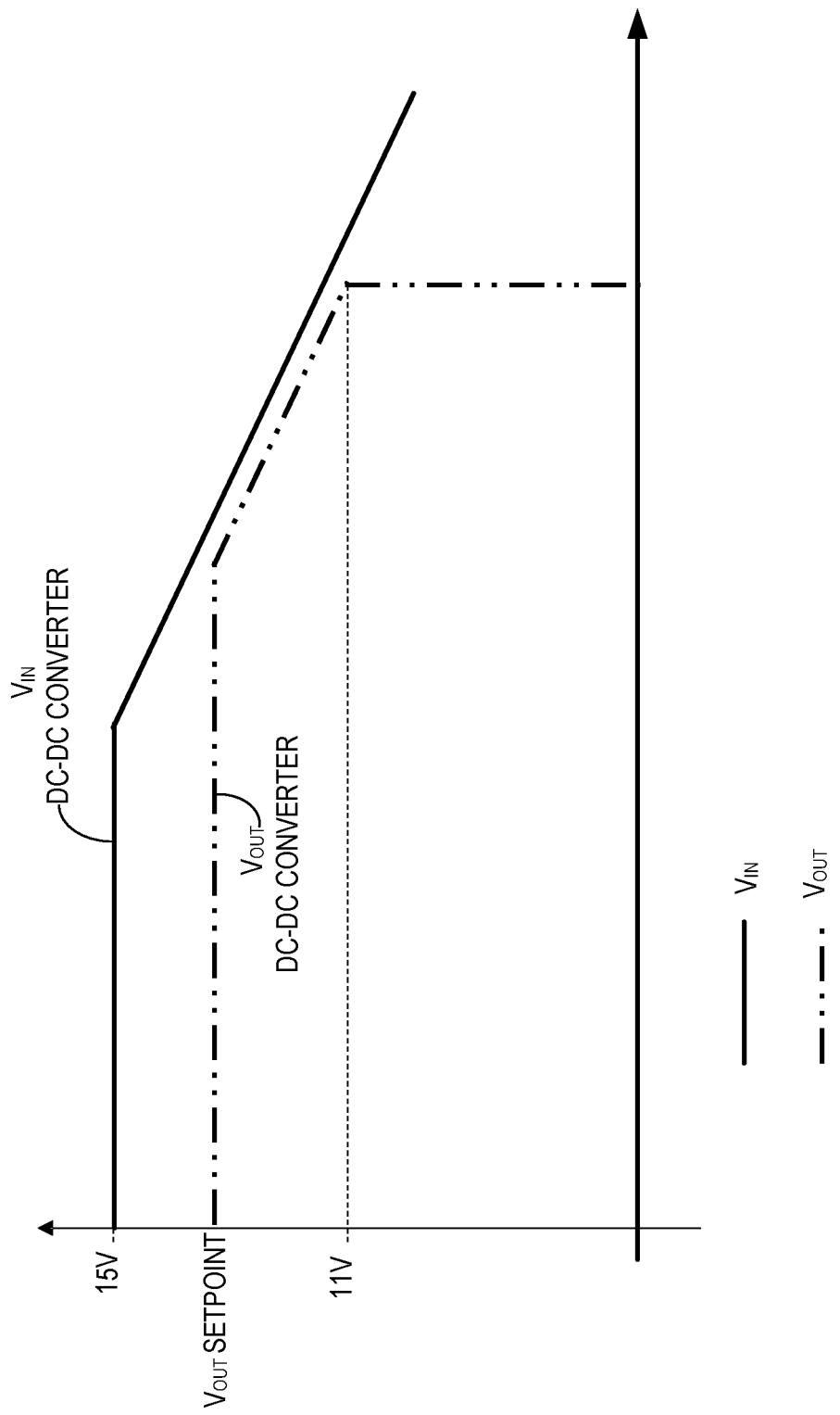
FIG. 4 illustrates an input voltage versus output voltage characteristic of a step down (buck) converter suitable for use in embodiments of the present disclosure.
Figure 5:
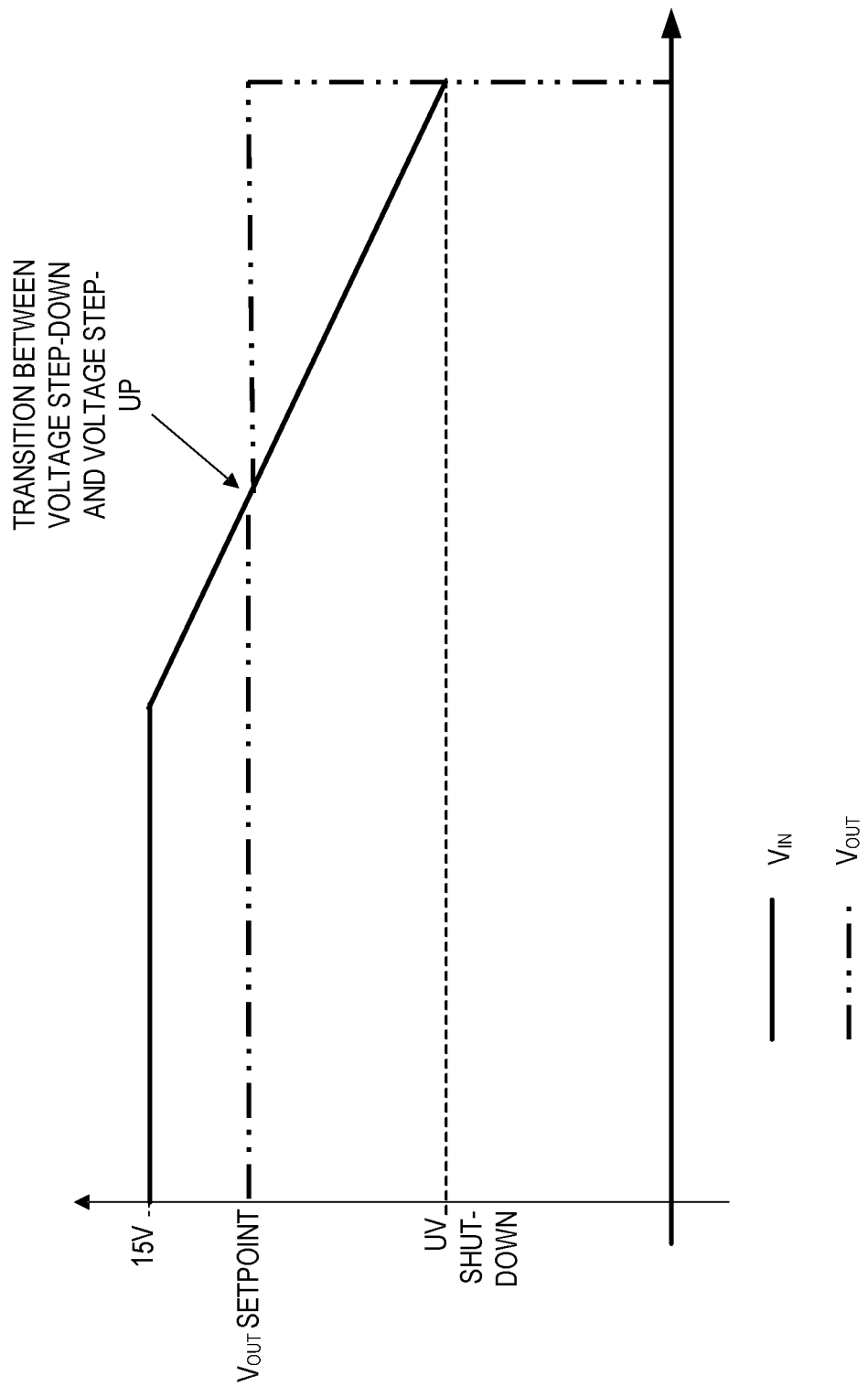
FIG. 5 illustrates an input voltage versus output voltage characteristic of a step up/step down (buck-boost) converter suitable for use in embodiments of the present disclosure.
Figure 6:
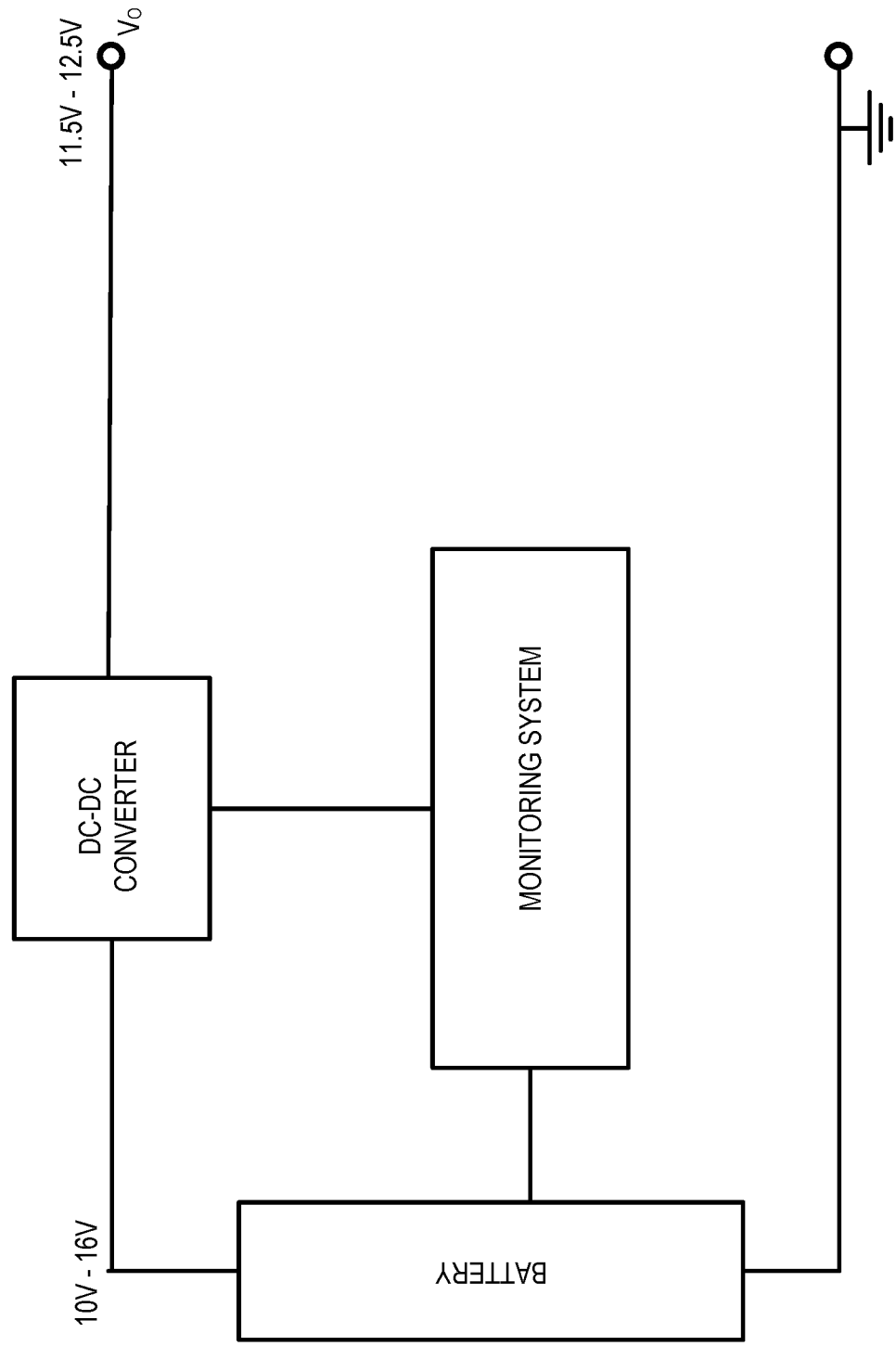
FIG. 6 illustrates a prior art system for using a DC-DC converter in combination with a battery and controller for providing a regulated output voltage to a load.
Figure 11:
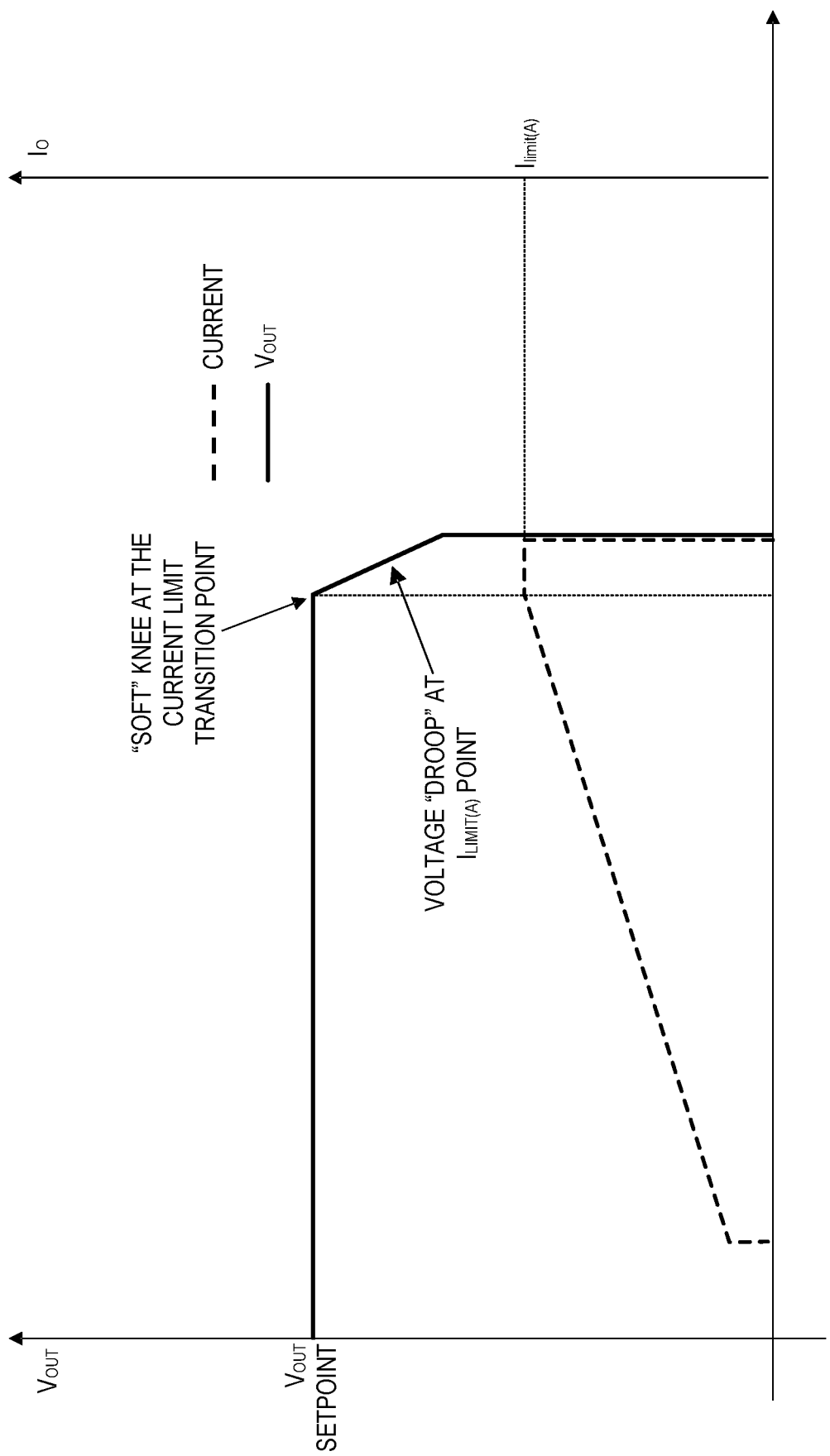
FIG. 11 illustrates an output current limit characteristic of a DC-DC converter suitable for use in embodiments of the present disclosure.

The DC-DC converter 170 can be of any of the types described herein (e.g., linear regulator, switching buck, switching buck-boost, or other), including, but not limited, to those described with respect to FIGS. 4, 5, and 11. The DC-DC converter 170 does not need to be configured (e.g., sized) to handle the maximum output power of the battery as in prior art implementations, but rather may be configured so that it can process about 25% to 30% of the maximum output power of the battery, since, in the system 100, the balance of the output power is delivered by the N FET/resistor pair network as is further described herein. This provides an advantage of system 100 over such prior art implementations using DC-DC converters, as the relative cost and size of a DC-DC converter is substantially higher than that of a network of FET/resistor pairs of similar power delivery capability.

FIG. 4 illustrates the input versus output voltage ($V_{IN}$ versus $V_{OUT}$) characteristics of a non-limiting example of a switching buck converter, which is suitable for implementation as the DC-DC converter 170 within the system 100. Note that for $V_{IN} > V_{OUT}$ Setpoint, the DC-DC converter operates as a normal buck converter, maintaining the output voltage $V_{OUT}$ to be substantially the same as the $V_{OUT}$ Setpoint. However, as the input voltage $V_{IN}$ drops to intersect the $V_{OUT}$ Setpoint, the output voltage $V_{OUT}$ is allowed to drop below $V_{OUT}$ Setpoint and essentially track the input voltage $V_{IN}$ until some threshold is reached, shown in this example as 11 V. This is referred to as a "low dropout" characteristic, which is commonly found in linear regulator designs. $V_{OUT}$ Setpoint is also referred to herein as the battery DC-DC converter setpoint (e.g., see FIG. 12), and may be predetermined to be at a voltage level at which the DC-DC converter 170 is configured to begin providing current to the load 105 subsequent to a failure of the PSU 101, such as further described herein with respect to FIGS. 12 and 19.

FIG. 5 illustrates the input versus output voltage ($V_{IN}$ versus $V_{OUT}$) characteristics of a non-limiting example of a buck-boost converter, which is also suitable for implementation as the DC-DC converter 170 within the system 100, in which the above described "low dropout" characteristic is not needed, as the DC-DC converter automatically switches from buck mode ($V_{IN}>V_{OUT}$ Setpoint) to boost mode when $V_{IN}<V_{OUT}$ Setpoint, thus maintaining the output voltage $V_{OUT}$ to be equal to the $V_{OUT}$ Setpoint regardless of the input voltage $V_{IN}$ until the UV Shutdown input voltage is reached.

FIG. 11 illustrates current limit characteristics for a DC-DC converter implemented within the system 100 in which the x-axis represents time. For all DC-DC converter output currents $I_o$ at or below an output current value referred to as the Current Limit Transition Point (where the output voltage of the DC-DC converter changes from constant voltage to constant current), the DC-DC converter is configured to maintain the output voltage $V_{OUT}$ of the DC-DC converter constant. As the output current $I_o$ (represented by the dashed line in FIG. 11) of the DC-DC converter reaches the Current Limit Transition Point ($I_{limit(A)}$), the output voltage $V_{OUT}$ drops slightly, or is said to "droop." This represents a transition of the DC-DC converter from a "constant voltage" mode to a "droop current limit" mode, where the output voltage $V_{OUT}$ is allowed to decrease below the $V_{OUT}$ Setpoint for a narrow range of output current values between $I_{limit(A)}$ and $I_{limit(A)}$ plus a few percent. In other words, for any value of current from 0 up to $I_{limit(A)}$, the output voltage $V_{OUT}$ of the DC-DC converter is maintained at the $V_{OUT}$ Setpoint. When $I_{limit(A)}$ is reached, the output voltage $V_{OUT}$ starts to droop, and this droop continues to accentuate as the output current continues to rise (the slope of the current at $I_{limit(A)}$ appears flat, but is actually only slightly positive).

During an event such as a hardware failure in the PSU 101 or an AC power outage (generally referred to herein as a failure of the PSU 101) causing the system 100 to operate so that the battery 108 discharges into the distribution bus 104, the voltage of the battery 108 will drop as discharge current increases (e.g., as shown in FIG. 8 and FIG. 10) where incremental increases in current as traced by the different characteristic curves exist at lower and lower voltages. This lowering of the voltage of the battery 108 as battery discharge current increases may be caused by the internal resistance or impedance of each battery cell. The amount of voltage drop of the battery 108 will depend on the magnitude of the current supplied by the battery 108 to the load 105 and the internal impedance of each of the cells in the battery 108. The chemical composition of the cells of the battery 108 may be chosen for their voltage, current capability, and impedance characteristics to be able to support the full power requirements of the distribution bus 104 to which they are coupled, while maintaining a voltage drop small enough to keep the distribution bus 104 within its voltage limits during the discharge event (e.g., substantially within a specified load voltage tolerance range).

In accordance with embodiments of the present disclosure, the system 100 may be configured so that at values of currents delivered to the load 105 that are below the Current Limit Transition Point (see $I_{limit(A)}$ depicted in FIG. 11) of the DC-DC converter 170 and at high states of charge of the battery 108, current may be supplied to the load 105 solely by the DC-DC converter 170, or by the DC-DC converter 170 in combination with some predetermined number of the FET/resistor pairs within the N FET/resistor pair network depending on the instantaneous operating point of the family of V-I curves of the battery 108.

Embodiments of the present disclosure will now be described with respect to a non-limiting exemplary application and operation of the system 100 in which the controller 102 is configured to deliver power to the load 105 within a specified load voltage tolerance range. Such a specified load voltage tolerance range may also be referred to herein as an application regulation window, which defines the voltage range that may be required by a load associated with a specific end-use application. Such a specified load voltage tolerance range may be composed of a nominal, or desired, output voltage $V_o$ and a +/− percentage range.

Figure 12:
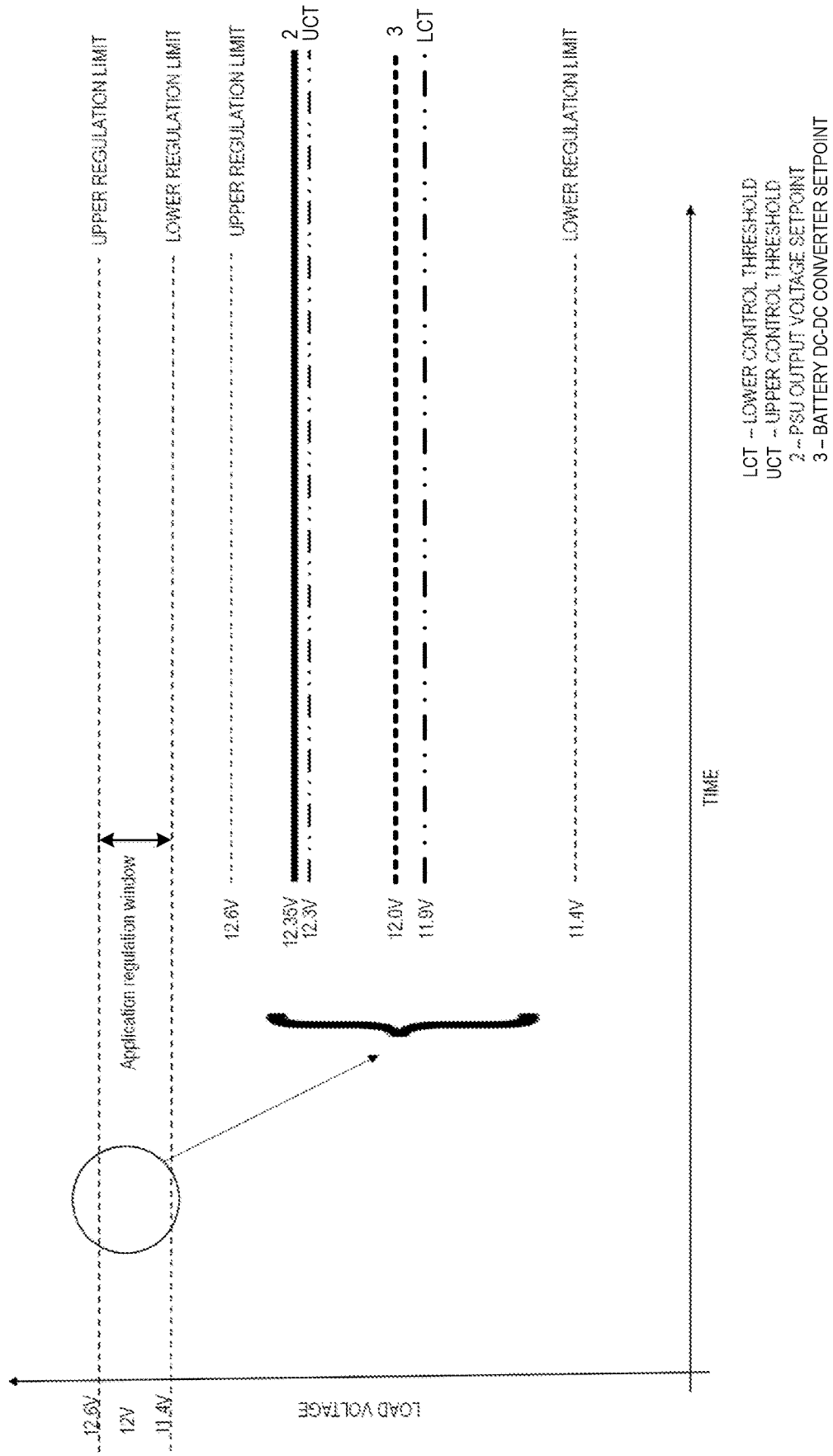
FIG. 12 illustrates a specified load voltage tolerance range and various control thresholds and setpoints for control of a system in accordance with embodiments of the present disclosure.

FIG. 12 illustrates a graphical representation of a non-limiting example of various setpoints and thresholds that may be implemented in the system 100 based on a desired output voltage $V_o$ (e.g., 12 V) and a specified load voltage tolerance range (e.g., +/−5%). Solely for the sake of describing embodiments of the present disclosure, reference will be made to the non-limiting exemplary V-I curves of FIG. 8. The specified load voltage tolerance range is shown and extends from a Lower Regulation Limit (in this example, 12 V−5%=11.4 V) to an Upper Regulation Limit (in this example, 12 V+5%=12.6 V). In accordance with embodiments of the present disclosure, the controller 102 may be configured to maintain the voltage supplied to the load 105 between the Upper and Lower Regulation Limits defining the specified load voltage tolerance range. FIG. 12 also shows that within the Upper and Lower Regulation Limits, some other thresholds and setpoints may be configured within the design of the system 100. There may be a PSU output voltage setpoint of the PSU 101, which may be predetermined during the design of the system 100 (for example, as a function of the dynamic characteristic of the load, response of the PSU control loop, etc.), which in this example is selected to be 12.35 V (as designated with the solid line 2 depicted in FIG. 12). The value for the PSU output voltage setpoint of the PSU 101 may be selected as the normal operating output voltage supplied by the PSU 101, and will be selected to be within the specified load voltage tolerance range. There may be a battery DC-DC converter setpoint of the DC-DC converter 170, which is set below the PSU output voltage setpoint, which in this example is selected to be 12.0 V (as designated with the dashed line 3 depicted in FIG. 12). There may be two control threshold setpoints, the Upper Control Threshold ("UCT"), set between the PSU output voltage setpoint and the battery DC-DC converter setpoint (in this example selected to be 12.3 V), and the Lower Control Threshold ("LCT"), which is set below the battery DC-DC converter setpoint and above the Lower Regulation Limit (in this example, the LCT is selected to be 11.9 V). The UCT and LCT values are further described with respect to FIGS. 14 and 15. Utilization of these thresholds and setpoints is further described herein.

The battery DC-DC converter setpoint is selected to be within the specified load voltage tolerance range, lower than the PSU output voltage setpoint, and above the LCT, and may be optimized by analyzing the dynamic characteristics of the system 100. Selection of the Upper and Lower Regulation Limits (i.e., the specified load voltage tolerance range) may be determined as a function of the specification and requirements of the load 105. The value of the UCT may be selected at some appropriate value below the PSU output voltage setpoint so that monitoring of a decrease of the output voltage $V_o$ below the UCT indicates to the battery system 106 that there may be a failure of the PSU 101, or that the output voltage Vo supplied to the load 105 by the battery system 106 has increased too much and may potentially increase outside of the specified load voltage tolerance range. The value of the LCT may be selected at some appropriate value below the battery DC-DC converter setpoint so that monitoring of a decrease of the output voltage $V_o$ below the LCT indicates to the battery system 106 that more current needs to be supplied from the battery 108 to the load 105 via the N FET/resistor pair network. Selection by the designer of the system 100 of the values for UCT and LCT, which are within the specified load voltage tolerance range, may be a function of the particular characteristics of the battery 108 (e.g., terminal voltage, characteristic curves, etc.), the dynamic characteristics of the load 105 (e.g., magnitude and rise and fall times of dynamic load currents), and the effective capacitance of the system 100, designated as $C_{LOAD}$ 160. This system capacitance, $C_{LOAD}$ 160, may represent a sum of capacitances coupled to the output node $V_o$ in the system 100 (e.g., any output capacitors that are present in the PSU 101 that have been included to help stabilize the feedback control loop of PSU 101, any output capacitors present at the output of the DC-DC converter 170 to improve transient response or help stabilize the control loop of the DC-DC converter 170, any capacitance associated with the load 105, and any other capacitance added by the designer of the battery system 106).

Figure 13:
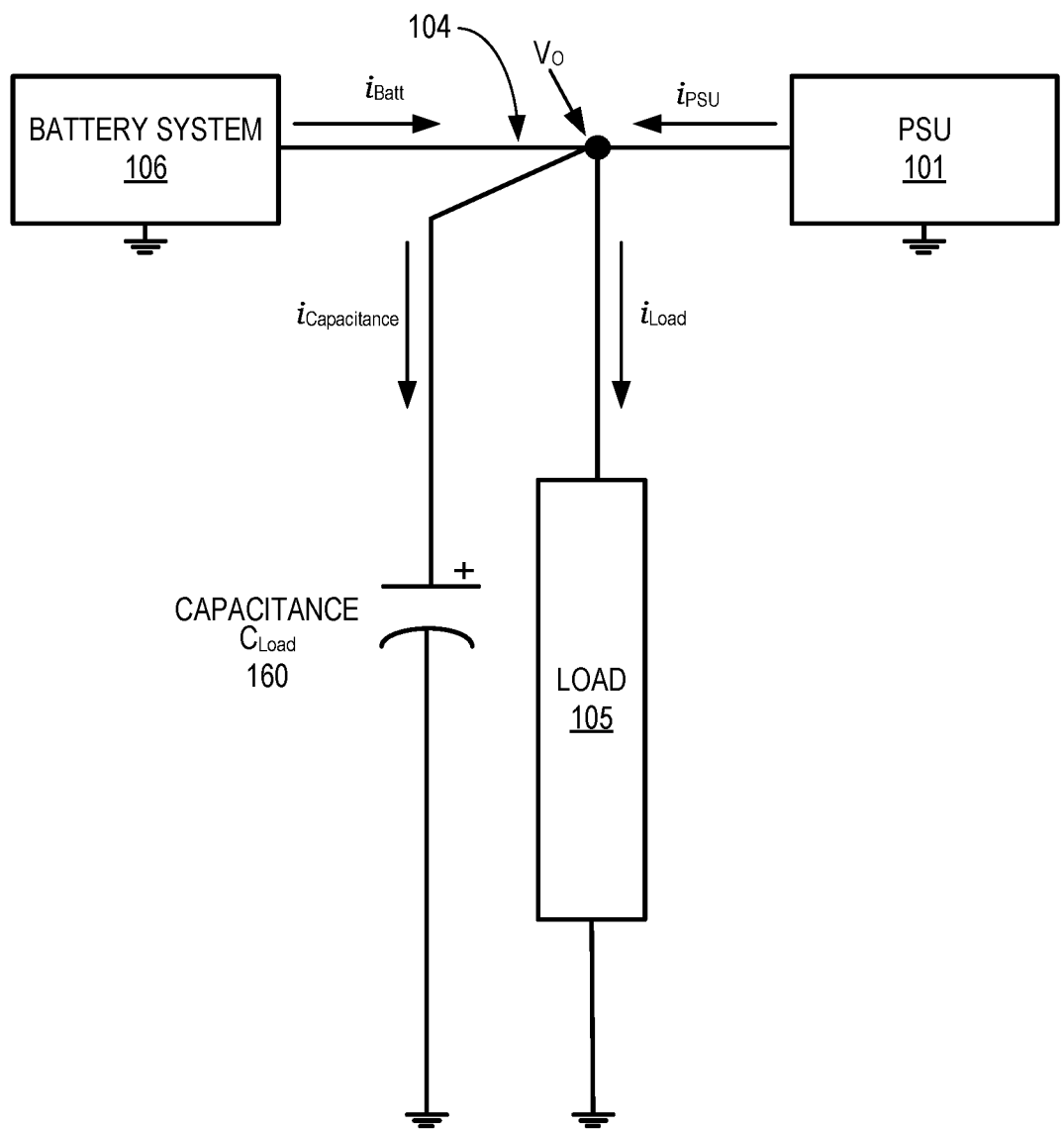
FIG. 13 illustrates a simplified block diagram of the system shown in FIG. 1 configured in accordance with embodiments of the present disclosure.

FIG. 13 illustrates a simplified block diagram of the system 100, which is presented for describing how monitoring of the voltage at the output node $V_o$ is utilized by the controller 102 to regulate an amount of impedance inserted between the battery 108 and the load 105 in accordance with embodiments of the present disclosure, as further described herein. The battery system 106 and the PSU 101 are coupled to the distribution bus 104 at the output node $V_o$. Also coupled to the distribution bus 104 at the output node $V_o$ are the load 105 and the system capacitance, $C_{LOAD}$ 160.

According to well-known circuit theory, the sum of any currents at any node in a system must be zero. Therefore, the sum of currents present at the node $V_o$ is:

$$i_{Batt} + i_{PSU} - i_{Capacitance} - i_{Load} = 0$$

Solving for $i_{Capacitance}$:

$$(i_{Batt} - i_{PSU}) - i_{Load} = i_{Capacitance}$$

Considering the characteristic equations for capacitors:

$$i_{Capacitance} = C^* dV_{Capacitance}/dt$$

where $dV_{capacitance}/dt = dV_o/dt$

From the above equation, it can be concluded that if $(i_{Batt} + i_{PSU})$ is equal to $i_{Load}$, then $i_{Capacitance}$ will be zero with respect to time, and $dV_{Capacitance}/dt$ will also be zero. As such, the voltage at the output node $V_o$ will be unchanging. If $(i_{Batt} + i_{PSU}) > i_{Load}$, then $i_{Capacitance}$ will be positive (i.e., the system capacitance $C_{LOAD}$ 160 will be charging), $dV_{Capacitance}/dt$ will also be positive, and the voltage at the output node $V_o$ will be increasing with respect to time. Correspondingly, if $(i_{Batt} + i_{PSU}) < i_{Load}$, then $i_{Capacitance}$ will be negative (i.e., the system capacitance $C_{LOAD}$ 160 will be discharging into the load 105), $dV_{Capacitance}/dt$ will also be negative, and the voltage at the output node $V_o$ will be decreasing with respect to time. These variables, the voltage across the system capacitance $C_{LOAD}$ 160 (i.e., $V_o$) and the current in the system capacitance $C_{LOAD}$ 160 ($C^* dV_{Capacitance}/dt$), represent a set of state variables of the system 100, which are utilized within embodiments of the present disclosure as described herein. Note that $C^* dV_{capacitance}/dt$ may be positive or negative and has the units of Amperes (current), while $dV_{capacitance}/dt$ may be positive or negative and has units of Volts/time. It also should be noted that $dV_{capacitance}/dt$ is also equal to $dV_o/dt$, and represents the same state variable.

Figure 14:
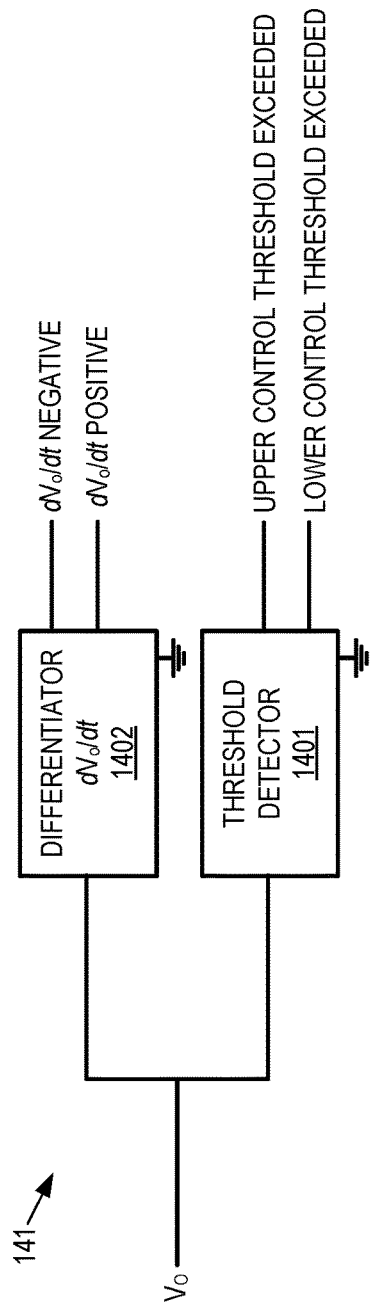
FIG. 14 illustrates a block diagram of a non-limiting example of control elements used in embodiments of the present disclosure that implements system state determination functions, input signals into the control elements, and outputs signals of the control elements.

FIG. 14 illustrates a block diagram of a non-limiting implementation for the state determination system 141 (see FIG. 1), which may be configured to determine values representing the state variables of the system 100 (i.e., $V_o$ and $dV_o/dt$). The Threshold Detector 1401 receives the output voltage $V_o$ as an input and compares $V_o$ to the UCT and LCT limits (see FIG. 12). A truth table for the operation of the Threshold Detector 1401 is shown in Table 16a of FIG. 16. If the output voltage $V_o$ is at a voltage level above the UCT, then a signal Upper Control Threshold Exceeded ("UCTE") signal is set to a logic level 1, and upon the output voltage $V_o$ dropping below the UCT, the UCTE will be reset to a logic level 0. If the output voltage $V_o$ is at a voltage level below the LCT, then a Lower Control Threshold Exceeded ("LCTE") signal is set to a logic level 1, and upon the output voltage $V_o$ rising above the LCT, the LCTE signal will be reset to a logic level 0.

The Differentiator 1402 receives the output voltage $V_o$ as an input and determines the sign of $dV_o/dt$, producing the $dV_o/dt$ Positive signal, which is set to a logic level 1 whenever $dV_o/dt > 0$, and the $dV_o/dt$ Negative signal, which is set to a logic level 1 whenever $dV_o/dt > 0$, thus providing to the controller 102 the instantaneous sign of the state variable $dV_o/dt$. A truth table for the operation of the Differentiator 1402 is shown in Table 16b of FIG. 16. The UCTE, LCTE, $dV_o/dt$ Negative, and $dV_o/dt$ Positive signals (also collectively referred to herein as the "state determination signals") are delivered from the state determination system 141 to the controller 102 via the signal lines 180. Note that the truth tables Table 16a and Table 16b contain entries that are shown as Not Allowed, or Not Possible. For example, it is not possible for the output voltage $V_o$ to be simultaneously both above the UCT and below the LCT, and for this reason the conditions UTCE=1 and LTCE=1 cannot occur simultaneously.

Figure 15:
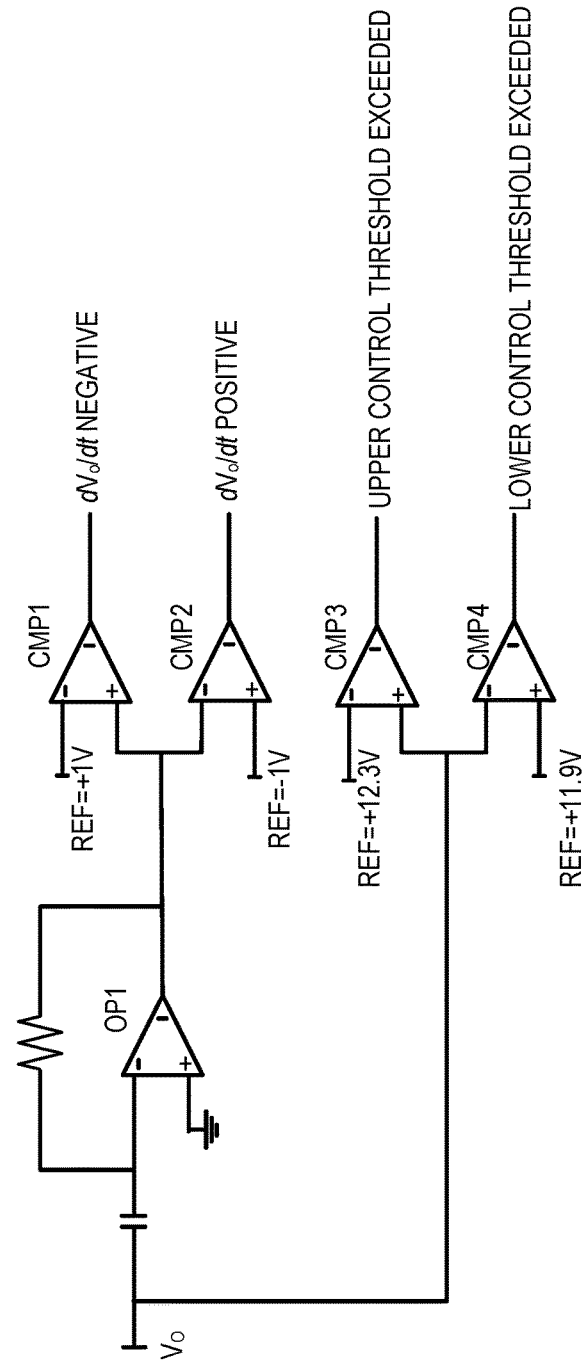
FIG. 15 illustrates a simplified schematic diagram of a non-limiting example of an electronic circuit implementing state determination functions in accordance with embodiments of the present disclosure.
Figure 18:
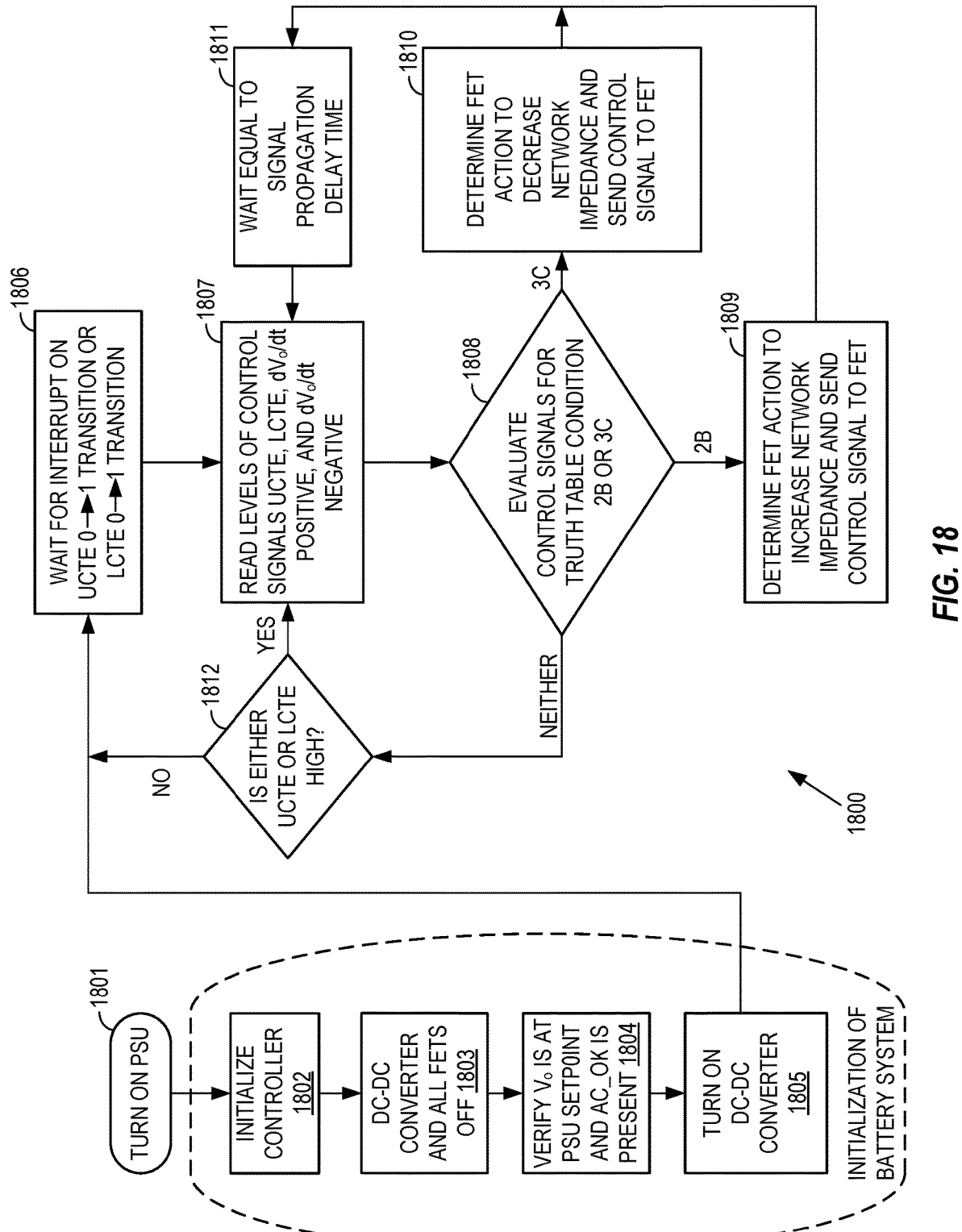
FIG. 18 illustrates a flowchart diagram of a process configured in accordance with embodiments of the present disclosure.

The controller 102 is configured to receive the state determination signals from the state determination system 141 and perform operations in accordance with the truth table set forth in Table 16c of FIG. 16 as further described with respect to the system and process 1800 of FIG. 18. FIG. 15 illustrates a simplified schematic diagram of a non-limiting example of how the state determination system 141 may be implemented with an operational amplifier (OP1) and voltage comparators (CMP1 . . . CMP4) to produce the truth table shown in Table 16c of FIG. 16, where the comparator reference values pertain to the example provided with respect to FIG. 12.

Considering the non-limiting example of the system 100 implemented with a battery 108 as described with respect to FIG. 8, when operating in the Region 4 area, inclusion of the DC-DC converter 170 provides for a higher electrical efficiency as well as higher precision of control over the exact input/output voltage difference over a wider range of currents, down to a zero (0) battery discharge current than previously available with respect to the system 700 of FIG. 7. This is evident by inspecting FIG. 9. As described herein, for any number N of the FET/resistor pairs, there are $N^2$ discrete control steps available. Due to the nature of the decreasing resistor values for resistors 710a . . . 710d in the system 700, the granularity of the control steps is not constant over the operating range, and it can be seen that while operating in the Region 3 area (see FIG. 8), fine control is available (note that in FIG. 9, 70% of the available control steps exist in the $V_{BAT} - V_o$ difference range of 0.5V or less), but when operating in the Region 4 area where the $V_{BAT} - V_o$ difference ranges from 0.5 V to 3.0 V, only very coarse and imprecise control is available due to the fewer number of available control steps. The Region 4 area is an operating range of poor electrical efficiency, since there will be a high V-I losses in resistive elements when in this range. Thus, the Region 4 area is where coarse control of the output voltage $V_o$ is provided by incorporation of the DC-DC converter 170, since, DC-DC converters alleviate such efficiency problems as they are specifically intended to have high efficiency in this area. Therefore, the system 700 has poor efficiency and control in the Region 4 area, while the system 100 alleviates these problems by incorporation of the DC-DC converter 170, which significantly improves performance in the Region 4 area, while the finer control of the output voltage $V_o$ can be provided by controlling the total impedance of the N FET/resistor pair network, as will be further described herein with respect to FIG. 18.

The choice of using a standard buck DC-DC converter or a buck-boost DC-DC converter may be determined by the requirements of the load 105 being powered by the system 100, as well as the V-I curves for the specific chemistry and configuration of the battery 108. As described herein with respect to FIG. 7, the system 700 is capable of delivering current to the load 705 only at voltages below the battery voltage. As a result, in many cases there will be energy in the battery 708 that cannot be utilized. Referring to FIG. 8, the Region 1 area identifies battery operating points that lie below the specified load voltage tolerance range for the load. Anytime the battery operating point exists in the Region 1 area of the family of V-I curves, the battery energy cannot be utilized. The resulting portion of the V-I curves that lie within this Region 1 area is thus quite small and exists only at very low states of charge where SOC is near zero. For many end-user applications, this unavailable Region 1 energy can simply be ignored. However, compare the V-I curves shown in FIG. 8 with operation of a different battery configuration as shown in FIG. 10, which represents the V-I curves of a four-series cell configuration of Iron Phosphate battery cells, operating at currents between 1 A and 60 A. It can be seen that the Region 4 area operation for the Iron Phosphate battery system of FIG. 10 is significantly smaller in area than with the Nickel Manganese Cobalt system of FIG. 8. Note that this may be favorable for 12 V systems. However, note that the area of the curves that exist in the Region 1 area for the Iron Phosphate battery system of FIG. 10 is significantly larger than that for the Nickel Manganese Cobalt system of FIG. 8 (for example, up to about 40% SOC when operating at a maximum load of 60 A). This represents a significant amount of unusable energy that is stranded in the Region 1 area as previously described, and may not be acceptable for a particular application that is desired to powered by such a battery system. A potential solution is to replace the battery system 706 in FIG. 7, with the battery system 106 in FIG. 1 implementing a DC-DC converter design (e.g., a buck-boost DC-DC converter) with an appropriate maximum power and current limit setting for the DC-DC converter 170, as this type of converter is capable of boosting battery voltages that are lower than voltages within the specified load voltage tolerance range up to output voltages compatible with the specified load voltage tolerance range. Note that care may need to be considered when using a buck-boost converter for the DC-DC converter 170 to prevent power circulation from output to battery (input) when the DC-DC converter 170 is boosting the output voltage above the voltage supplied by the battery 108. To prevent this, the connection point of the output of the DC-DC converter 170 may be moved to the drain side of the transistor 111 (as compared to the FET/resistor pairs 110b ... 110d and 150b ... 150d, which are coupled to the source side of the transistor 111). When operating in boost mode, the transistor 111 is switched OFF, thus blocking any power circulation from the output of the DC-DC converter 170 to the battery 108. A result of the operation of the DC-DC converter 170 in boost mode is that 100% of the output power delivered while the battery 108 is discharging in the Region 4 area should be delivered through the DC-DC converter 170 and not through the N FET/resistor pair network. This means that operation of the system 100 in the Region 4 area should be at a power level at or below the power limit and Current Limit Transition Point ($I_{limit(A)}$) of the DC-DC converter 170. It is not unusual, however, in applications in which the system 100 is utilized for computer servers for this "reduced power" operation from the battery 108 at low SOC to be specifically allowed.

FIG. 17 illustrates several non-limiting examples of FET/resistor activation/deactivation sequences that may be implemented within the controller 102 depending on specific battery and load characteristics and requirements. Table 17a represents a binary counting sequence similar to the one described with respect to FIG. 9, which may be implemented within the controller 102. The FETS 110b, 110c, and 110d may be switched ON in a binary upward counting sequence, where the FET 110b represents the least significant bit and the FET 110d represents the most significant bit, and where each succeeding binary digit represents a decreasing total impedance of the N FET/resistor pair network. Thus, counting upward one binary digit at a time results in decreasing the total impedance of the N FET/resistor pair network, and counting downward one digit at a time results in increasing the total impedance of the N FET/resistor pair network. Table 17b represents a sequential sequence in which the FETS may be switched ON/OFF sequentially, rather than in a binary counting mode, such that in order to decrease the total impedance of the N FET/resistor pair network, the first FET 110b is switched ON, then the FET 110c is switched ON (without first switching off the FET 110b), and finally the FET 110d is switched ON. Likewise, to increase the impedance of the N FET/resistor pair network, the controller 102 may be configured to switch OFF the FET in the most significant bit position, then switch OFF the FET in the next most significant bit position, and so on until all FETs are switched OFF. This sequential sequence results in fewer discrete impedance steps, but a faster arrival at the minimum or maximum impedance value when starting from any given impedance value.

In accordance with embodiments of the present disclosure, the binary counting sequence represented in Table 17a may be implemented within the controller 102 when the battery 108 is composed of NMC battery cells such as those represented in FIG. 8, where only about 20% of the area traced by the minimum current V-I curve and the maximum current V-I curve lies within the Region 2 area, and the majority of the area outside of the Region 2 area is located above the Region 2 area in Regions 3 and 4. In accordance with embodiments of the present disclosure, the sequential sequence of Table 17b may be implemented within the controller 102 when the battery 108 is composed of Iron Phosphate battery cells such as that represented in FIG. 10. Here, the area traced by the minimum and maximum current V-I curves lies approximately 60% within the Region 2 area and only about 30% lies above the Region 2 area in Regions 3 and 4.

An alternative binary/sequential or "hybrid" counting approach is shown in Table 17c, where the binary counting sequence and sequential sequence are combined, with the FETs 110b and 110c operated in a binary sequence and the FET 110d added in a sequential sequence after the FETs 110b and 110c have reached the maximum binary value.

Embodiments of the present disclosure are further illustrated by the following example, which is set forth to illustrate the presently disclosed subject matter and are not to be construed as limiting.

A non-limiting example of an implementation of the system 100 will now be described. In this 12 V example ($V_o$=12 V), the Upper Regulation Limit is 12.6 V and the Lower Regulation Limit is 11.4 V, defining the specified load voltage tolerance range. The exemplary battery 108 is based on the four-series cell Iron Phosphate battery shown in FIG. 10, with a maximum load current of 60 Amperes, and a minimum load current of 1 Ampere. The DC-DC converter 170 is configured as a suitable buck DC-DC converter (with characteristics shown as in FIG. 4), with a Current Limit Transition Point $I_{limit(A)}$ as in FIG. 11 chosen to be 15 Amperes, or 25% of the maximum current of the load 105. As depicted in FIG. 12, the battery DC-DC converter setpoint is set to 12.0 V, the PSU output voltage setpoint is set to 12.35 V, the UCT is set to 12.3 V, and the LCT is set to 11.9 V. The controller 102 is configured to step the impedance of the N FET/resistor pair network up and down in a sequential manner as represented in Table 17b of FIG. 17. The resistor 150b may be configured with the highest resistive value among all the resistors 150b . . . 150d. In accordance with embodiments of the present disclosure, this resistive value for the resistor 150b may be determined by the maximum value of voltage for the battery 180 traced by the allowed V-I curves of minimum and maximum load current design points. In this example, this resistive value may be identified by Point A shown in FIG. 10 (13.4 V) and subtracting the value of the battery DC-DC converter setpoint, which is 12.0 V and represented by Point B shown in FIG. 10. The result is then divided by the Current Limit Transition Point ($I_{limit(A)}$, or 15 A) of the DC-DC converter 170, which provides the desired resistive value for the resistor 150b. Using these values, the result is:

Resistive value of the element 150b=(13.4 V−12.0 V)/15 A

Resistive value of the element 150b=93 milli-Ohms

The resistor 150c may be configured to have the next lowest resistive value in the sequence, and may be configured to have a resistive value equal to or slightly less than $\frac{1}{10}^{th}$ of the resistive value of the resistor 150b (e.g., 9 milli-Ohms). The resistor 150d may be configured to have a resistive value of equal to or slightly less than $\frac{1}{10}^{th}$ that of the resistor 150c (e.g., 0.9 milli-Ohms). As a result, the total resistance of the N FET/resistor pair network when all FETS are switched ON is 0.8 milli-Ohms. This provides a total voltage drop of 48 milli-Volts across the N FET/resistor pair network at a maximum load of 60 A.

Since, as shown in FIG. 10, the Iron Phosphate cell characteristic V-I curves lie largely within the Region 2 operating range for values of current above the Current Limit Transition Point $I_{limit(A)}$ of 15 A and below the maximum defined load current of 60 A, the system 100 may be configured with such a relatively low number of FET/resistor pairs in parallel, a sequential FET activation sequence, and a relatively aggressive reduction in resistor values for each sequential pair as previously described. If the system 100 was configured with a battery 108 composed of NMC cells such as those represented by FIG. 8, the system 100 may be configured with a larger number of FET/resistor pairs in parallel, a binary counting sequence, and a more gradual reduction in resistor values for each sequential pair, since, as shown in FIG. 8, a relatively greater portion of the V-I curves exist above the Region 2 operating range (i.e., the specified load voltage tolerance range).

Referring again to FIG. 1, when properly operating (i.e., AC input power is present and within values specified, and/or no hardware failures exist within the PSU 101), the PSU 101 is designed to have sufficient output current capacity to supply the full load current to the load 105. If there is a failure of the AC input to the PSU 101 or if there is a hardware failure within the PSU 101, the PSU 101 will cease to provide current to the load 105, and the battery system 106 will discharge energy from the battery 108 to supply current to the load 105.

In accordance with embodiments of the present disclosure, the battery system 106 is configured to supply the current from the battery 108 between current paths provided by the DC-DC converter 170 in combination with the N FET/resistor pair network in a manner to maintain the voltage at the output node $V_o$ to be within the specified load voltage tolerance range delimited by the Upper and Lower Regulation Limits as shown in FIG. 12. Depending on the current required to meet the demand of the load 105, current may flow through any combination of the DC-DC converter 170 and elements of the N FET/resistor pair network. The controller 102 may be configured to control the balancing of the output current from the discharging battery 108 as between the DC-DC converter 170 and the N FET/resistor pair network so that the voltage supplied to the load 105 is regulated between the Upper and Lower Regulation Limits (i.e., within the specified load voltage tolerance range). The following descriptions represent example transitions that can occur as part of the current balancing and voltage regulation process.

A non-limiting exemplary process for providing current from the battery 108 to the load 105 by the battery system 106, in accordance with embodiments of the present disclosure, is now described with respect to the system and process 1800 of FIG. 18, which may be implemented for operation within the controller 102. In this example, the DC-DC converter 170 operates in accordance with FIG. 4, the state determination system 141 is configured to operate in accordance with the truth tables set forth in Tables 16a and 16b of FIG. 16, and the controller 102 is configured to operate in accordance with the truth table set forth in Table 16c of FIG. 16 and the FET sequences set forth in the Table 17b of FIG. 17. The signals generated by the state determination system 141 according to the truth tables set forth in Tables 16a and 16b are received by the controller 102 via the signal lines 180.

Figure 19:
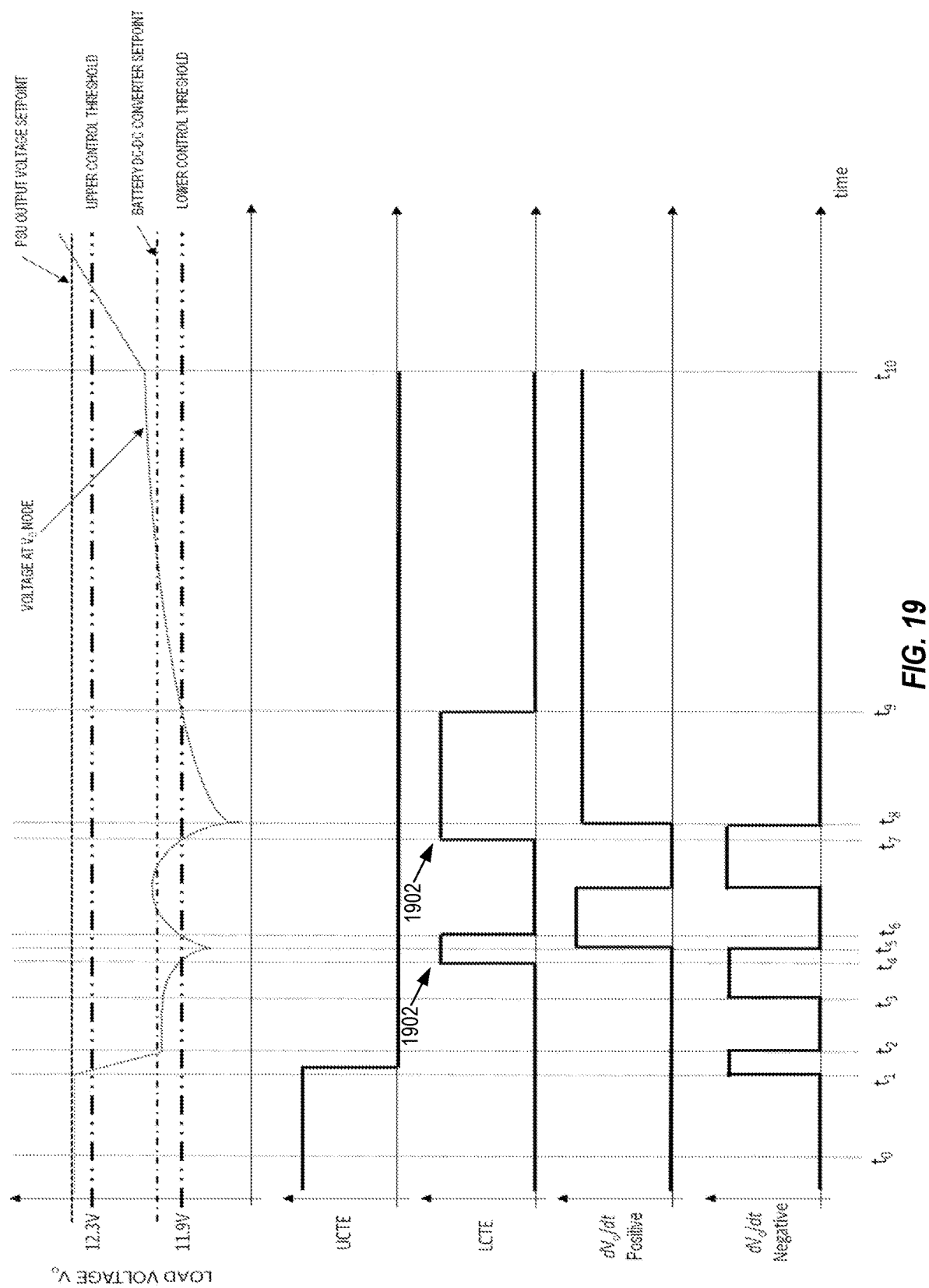
FIGS. 19-20 illustrate a time domain analysis showing the instantaneous level of the voltage at the output node $V_o$ of the system illustrated in FIG. 1, the slope (rising or falling) of the voltage at the output node $V_o$, and the resulting instantaneous state of the control signals for various exemplary situations that may be incurred during the operation of the system.
Figure 20:
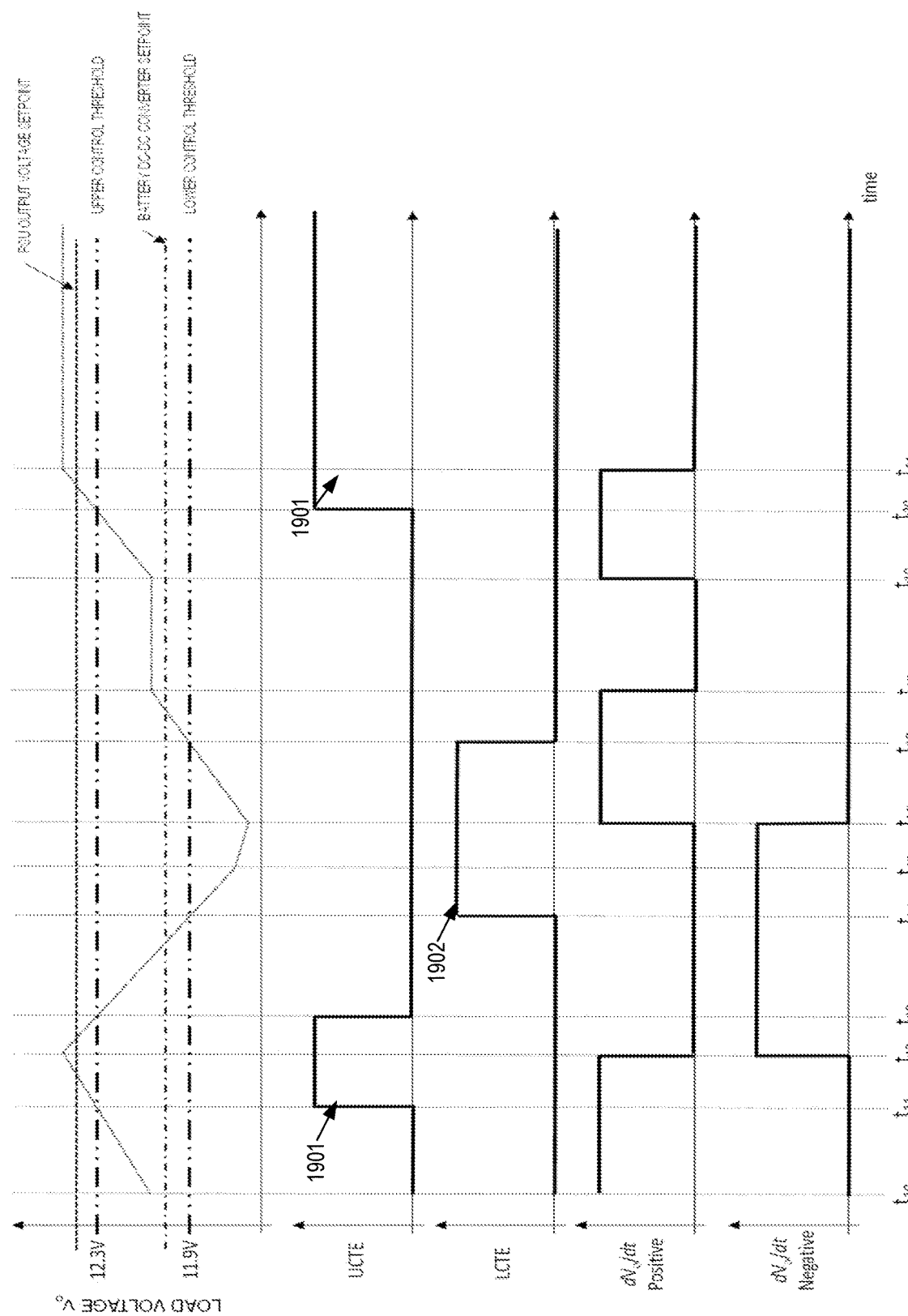

FIGS. 19-20 illustrate a time-domain analysis showing exemplary operations of the system 100 of a supply of the output voltage from the battery 108 and the PSU 101 to the output node $V_o$, and corresponding transitions of the signals provided from the state determination system 141 to the controller 102. FIG. 19 illustrates the exemplary time-domain analysis during the time interval $t_0$-$t_{10}$, while FIG. 20 illustrates the exemplary time-domain analysis during the time interval $t_{10}$-$t_{21}$. The exemplary operation of the system and process 1800 is described with reference to the time instances of FIG. 19 and FIG. 20, describing what occurs at the moment of each time instance and during the time intervals in between each time instance. Note that FIG. 19 and FIG. 20 are not drawn to scale, and certain time intervals shown may be measured in microseconds while others may be measured in seconds or minutes.

In the process block 1801, the PSU 101 is properly operating, and may have been turned on at some previous period of time. In this example, the PSU 101 output voltage setpoint is 12.35 V, supplying the full load current to the load 105. Also, at some previous period of time, components of the battery system 106 are initialized (represented by the dashed line around the process blocks 1802-1805). The controller 102 may be initialized in the process block 1802 (e.g., when it receives the AC_OK signal). In the process block 1803, the controller 102 switches OFF the DC-DC converter 170 and all of the FETs 110$b$ ... 101$d$ via the signal lines 171 and 121$b$ ... 121$d$, respectively. In the process block 1804, the controller 102 may be configured to verify that the voltage present at the output node $V_o$ is equal to the PSU output voltage setpoint (e.g., by a voltage sensor implemented within the state determination system 141, such as in a similar manner as the battery voltage sensor 142, which sensed level of the output voltage Vo is provided to the controller 102 via the signal lines 180), and that the AC_OK signal on the signal line 112 is present (e.g., a logic level 1 is being received).

In the process block 1805, the DC-DC converter 170 is turned on via the control signal 171, whereby the DC-DC converter 170 stabilizes its output to its battery DC-DC converter setpoint (in this example, 12.0 V). However, because the voltage at the output node $V_o$ is being held at 12.35 V by the PSU 101, no current flows from the DC-DC converter 170, and all current into the load 105 is provided by the PSU 101. At some point in time after the DC-DC converter 170 has stabilized its output, the system and process 1800 proceeds to the process block 1806, and waits for an interrupt generated by a rising edge transition of either the UCTE or LCTE signal received by the controller 102 from the state determination system 141 via the signal lines 180. This waiting condition represents a steady state condition, which is represented in this example as the system state shown at the time instant $t_0$ in FIG. 19. As will be further described, the controller 102 may be configured to generate an interrupt upon receiving the rising edge (a logic level 0 to a logic level 1 transition) of either the UCTE signal (e.g., see 1901 in FIG. 19) or the LCTE signal (e.g., see 1902 in FIG. 19 and FIG. 20). This interrupt transitions the system and process 1800 from the process block 1806 to the process block 1807 in which the state determination signals from the state determination system 141 are evaluated to determine if any FET control action is required to adjust the impedance of the N FET/resistor pair network either up or down, as will be further described herein.

During the time interval $t_0$ to $t_1$, this steady state condition in the process block 1806 continues. The controller 102 maintains the FETS 110$b$ ... 110$d$ switched OFF. All load current is continuing to be supplied by the PSU 101, which is regulating the voltage supplied to the output node $V_o$ at a point above the battery DC-DC converter setpoint of the DC-DC converter 170. The voltage supplied to the output node $V_o$ is above the UCT, so the UCTE signal is at a logic level 1 (see Table 16$a$ of FIG. 16), and since the voltage Vo is not varying, the state determination system 141 maintains the $dV_o/dt$ Positive and $dV_o/dt$ Negative signals at logic level 0 values (see Table 16$b$ of FIG. 16). No interrupts have been generated in the process block 1806 as the controller 102 is still waiting for a rising edge on either the UCTE or LCTE signals.

Consider for this example that at some subsequent time period, either an AC line failure or a hardware failure of the PSU 101 occurs (which would be signaled to the controller 102 via the AC_OK signal 112). This is designated in FIG. 19 as the time instant $t_1$. Eventually, the output voltage of the PSU 101 begins to drop from 12.35 V. Dropping of the voltage $V_o$ results in the $C_{LOAD}$ 160 now discharging and providing some of the current to the load 105, with the PSU 101 supplying the remainder of the current. As the voltage $V_o$ begins to drop at the time instant $t_1$, this will be sensed by the state determination system 141, resulting in a transition of the $dV_o/dt$ Negative signal from a logic level 0 to a logic level 1 (see Table 16$b$ of FIG. 16). Subsequent to the time instant $t_1$, the voltage $V_o$ sufficiently decreases to be below the UCT, resulting in the state determination system 141 transitioning the UCTE signal from a logic level 1 to a logic level 0. The process block 1806 is still waiting for an interrupt caused by either the UCTE or LCTE signals transitioning from a logic level 0 to a logic level 1. The decreasing of the voltage $V_o$ continues during the time interval $t_1$ to $t_2$ as more energy may be delivered from $C_{LOAD}$ 160 to the load 105.

At the time instant $t_2$, the voltage $V_o$ has now dropped until it has reached the battery DC-DC converter setpoint of the DC-DC converter 170, which has been set to 12.0 V. During the time interval $t_2$ to $t_3$, current is being supplied from the battery 108 through the DC-DC converter 170, which holds the voltage $V_o$ steady as the current supplied by the DC-DC converter 170 ramps from zero current at the time instant $t_2$ to the Current Limit Transition Point $I_{limit(A)}$ at the time instant $t_3$. In response to this unchanging value of the output voltage $V_o$ during the time interval $t_2$ to $t_3$, the $dV_o/dt$ Negative signal received by the controller 102 from the state determination system 141 reverts to a logic 0 value (see Table 16$b$ of FIG. 16).

Upon reaching the Current Limit Transition Point $I_{limit(A)}$ at the time instant $t_3$, the DC-DC converter 170 will enter its voltage "droop" mode (see FIG. 11), and the output voltage $V_o$ will begin to decrease as $C_{LOAD}$ 160 again begins to supply energy to the load 105, which can be seen during the time interval $t_3$ to $t_4$ in FIG. 19. The $dV_o/dt$ Negative signal delivered to the controller 102 from the state determination system 141 transitions to a logic level 1 during this time interval. However, no interrupt is yet generated in the process block 1806. Therefore, the controller 102 maintains the FETS 110$b$ ... 110$d$ switched OFF (corresponding to the Impedance Sequence 0 set forth in Table 17$b$ of FIG. 17) according to the truth table of Table 16$c$ of FIG. 16.

At the time instant $t_4$, the output voltage $V_o$ crosses below the LCT causing the state determination system 141 to transition the LCTE signal from a logic level 0 to a logic level 1 (indicated as 1902 in FIG. 19 at the time instant $t_4$), and an interrupt is generated by the process block 1806. The system and process 1800 proceeds to the process block 1807, and the levels of the state determination signals received from the state determination system 141 are read by the controller 102. In accordance with the truth tables of Tables 16$a$ and 16$b$ of FIG. 16, the levels of the signals are UCTE=0, LCTE=1, $dV_o/dt$ Positive=0, and $dV_o/dt$ Negative=1. The system and process 1800 then proceeds to the process block 1808 to determine whether these signal levels correspond to either of the conditions 2b or 3c as set forth in the truth table of Table 16$c$ of FIG. 16. Since in this example, at the time instant $t_4$, the levels of the state determination signals are determined to correspond to condition 3c in the Table 16$c$, the system and process 1800 proceeds to the process block 1810, where the controller 102 determines that the impedance of the N FET/resistor pair network needs to decrease. Since the N FET/resistor pair network is currently in Impedance Sequence 0 (i.e., all FETs are switched OFF), the next step in Table 17$b$ of FIG. 17 representing a decreased impedance is identified as Impedance Sequence 1. In the process block 1810, the controller 102 switches ON the FET 110$b$ via the control signal 121$b$ to configure the N FET/resistor pair network into the configuration of Impedance Sequence 1.

The time interval $t_4$ to $t_5$ represents that there may exist a propagation delay along the control line 121b of the switch ON signal sent to the FET 110b. Such a propagation delay may be composed of the processing time of the process block 1806 in processing the interrupt at the time instant $t_4$, the execution times of the process blocks 1807, 1808, and 1810, the signal propagation time needed for the ON signal to travel from the controller 102 to the FET 110b, and the switching time of the FET 110b. This propagation time may be relatively short (e.g., on the order of microseconds), but there may be a measurable time delay between the time instant $t_4$ when the need for an impedance change is first recognized and the time instant $t_5$ when the impedance state of the N FET/resistor pair network is actually changed and the system state variables respond. To prevent overcorrection of the N FET/resistor pair network, the process block 1811 may be optionally included to insert a time delay (e.g., equal to the longest possible value of propagation delay) before the system and process 1800 returns to the process block 1807 to again reset the status of the state determination signals. The time instant $t_5$ represents the end of the propagation delay period, and at this instant it can be seen that the system state has responded to the control action taken at the time instant $t_4$ (i.e., an increase in the voltage $V_o$). Therefore, after the time instant $t_5$, the system and process 1800 returns to the process block 1807.

At the time instant $t_5$, the optional propagation delay of the process block 1811 has completed, and the FET 110b is now switched ON. The current generated by the battery 108 that was previously flowing to the load 105 exclusively through the DC-DC converter 170 now has a second path to the load 105, i.e., through the FET 110b and the resistor 150b. The result is that the current of the DC-DC converter 170 now drops below the Current Limit Transition Point as current is diverted away from the DC-DC converter 170, and the output voltage of the DC-DC converter 170 and therefore the output voltage $V_o$ rises back towards its 12.0 V setpoint.

Subsequent to the time instant $t_5$, in the process block 1807, the controller 102 again reads the state determination signals and passes control to the process block 1808. As indicated by the example illustrated in FIG. 19, during the time interval $t_5$ to $t_6$, the voltage $V_o$ is below the LCT, yet the voltage $V_o$ is rising, and the state determination signals received from the state determination system 141 will result in the controller 102 determining in the process block 1808 that the N FET/resistor pair network is operating according to condition 3b (see Table 16c of FIG. 16), which corresponds to the "Neither" path exiting from the process block 1808. In the process block 1812, the signals UCTE and LCTE are each evaluated by the controller 102 for a logic level 1. Since the LCTE signal has remained at a logic level 1, the system and process 1800 will continuously loop from the process block 1812 to the process block 1807 to the process block 1808 and back to the process block 1812 until the rising output voltage $V_o$ crosses above the LCT threshold (indicated as occurring at the time instant $t_6$) resulting in a transition of the LCTE signal from a logic level 1 to a logic level 0.

At the time instant $t_6$, the output voltage $V_o$ continues to rise because the output current from the DC-DC converter 170 continues to increase. Upon the first invocation of the process block 1812 after the LCTE signal makes its transition to a logic level 0, the system and process 1800 will exit the process block 1812 and return to the process block 1806 and re-engage the wait state for an interrupt triggered by a rising edge on either the UCTE or LCTE signals.

Referring again to FIG. 19, during a first portion of the time interval $t_6$ to $t_7$, the output voltage $V_o$ will continue its increase towards the battery DC-DC converter setpoint of 12.0 V as output current rises in the DC-DC converter 170. Eventually, the Current Limit Transition Point will be reached, shown at approximately the midpoint between the time instants $t_6$ and $t_7$. At this moment, the DC-DC converter 170 will again enter its "droop" mode, and the output voltage $V_o$ will begin to fall (see FIG. 11). This inversion of $dV_o/dt$ is shown in the change in signal levels on $dV_o/dt$ Positive and $dV_o/dt$ Negative that occurs midway between the time instants $t_6$ and $t_7$. During the time interval $t_6$ to $t_7$, there is no rising edge on either of the UCTE or LCTE signals, so no interrupt is generated, and the system and process 1800 remains in the process block 1806.

At the time instant $t_7$, the output voltage $V_o$ crosses and falls below the LCT, which generates a rising edge on the LCTE signal (indicated as 1902 in FIG. 19 at the time instant $t_7$) and an interrupt, wherein the system and process 1800 proceeds from the process block 1806 to the process block 1807, where the controller 102 reads the state determination signals received from the state determination system 141. The system and process 1800 then proceeds to the process block 1808 to evaluate the state determination signals, which will indicate that the combination of UCTE=0, LCTE=1, $dV_o/dt$ Positive=0, and $dV_o/dt$ Negative=1 corresponds to condition 3c in Table 16c. As a result, the system and process 1800 then proceeds to the process block 1810, where it is determined that since the N FET/resistor pair network is configured in Impedance Sequence 1 according to the truth table of Table 17b, the next step in the Impedance Sequence corresponding to condition 3c is Impedance Sequence 2. To achieve this, the controller 102 maintains the FET 110b switched ON, switches ON the FET 110c via the control signal 121c, and then exits the process block 1810 and proceeds to the process block 1811. During the time interval $t_7$ to $t_8$, the system and process 1800 may remain in the process block 1811, waiting for the FET 110c to switch ON.

At the time instant $t_8$, when the FET 110c has switched ON, the current generated by the battery 108 now has conductive paths through the DC-DC converter 170, the FET 110b/resistor 150b pair, and the FET 110c/resistor 150c pair. The addition of the conductive path through the FET 110c/resistor 150c pair and the much lower impedance of this new conductive path diverts more current from the DC-DC converter 170, bringing its current down to a level below $I_{limit(A)}$, and thus the output voltage $V_o$ will again start to increase as the DC-DC converter 170, now operating at a reduced current, will attempt to regulate its output at its battery DC-DC converter setpoint (in this example, 12.0 V). The system and process 1800 will then proceed to the process block 1807 whereby the controller 102 reads the state determination signals. In the process block 1808, the controller 102 evaluates the levels of the state determination signals, which are determined to be UCTE=0, LCTE=1, $dV_o/dt$ Positive=1, and $dV_o/dt$ Negative=0. This combination of the levels of the state determination signals corresponds to condition 3b as set forth in Table 16c, for which the Impedance Action Required is "None." The system and process 1800 then proceeds to the process block 1812, and since the voltage $V_o$ is below LCT, LCTE=1, and the system and process 1800 will loop from the process block 1812 to the process block 1807 to the process block 1808 and then to the process block 1812 and remain in this loop until the voltage $V_o$ increases above LCT.

Referring to FIG. 19, the time instant $t_9$ indicates that the output voltage $V_o$ has risen and crossed above LCT, causing the LCTE signal to reset to a logic level 0 (see Table 16a). Following the transition of the LCTE signal to a logic level 0, the system and process 1800 will proceed to the process block 1806 on its next pass through the process block 1812. The system and process 1800 will remain in the process block 1806 until the next interrupt caused by a rising edge on either of the UCTE or LCTE signals.

As indicated in FIG. 19, the time interval encompassing $t_8$ to $t_{10}$ represents a steady state condition, with current to the load 105 kept at a constant level, and the battery 108 slowly discharging. Controller 102 maintains the N FET/resistor pair network in the Impedance Condition 2 configuration.

In this example, the time instant $t_{10}$ shows an occurrence of a discontinuity in the trajectory of the output voltage $V_o$ in which $dV_o/dt$ suddenly increases from a relatively small positive value to a relatively larger positive value. A condition that could cause this sort of discontinuity is a sudden decrease of the current into the load 105, resulting in a positive current into $C_{LOAD}$ 160 and a corresponding change (increase) in $dV_o/dt$.

Referring to FIG. 20, during the time interval $t_{10}$ to $t_{11}$, the value of the output voltage $V_o$ is increasing, and the system and process 1800 is in the process block 1806 waiting for an interrupt.

The time instant $t_{11}$ indicates a situation when the output voltage $V_o$ crosses above the UCT causing a rising edge on the UCTE signal (indicated as 1901 in FIG. 20 at the time instant $t_{11}$) and generating an interrupt in the process block 1806. The system and process 1800 then proceeds to the process block 1807, and the state determination signals received from the state determination system 141 are received by the controller 102. In the process block 1808, the controller 102 evaluates the received signals, which in this situation have been produced by the state determination system 141 (see Tables 16a and 16b of FIG. 16) to be UCTE=1, LCTE=0, $dV_o/dt$ Positive=1, and $dV_o/dt$ Negative=0. According to Table 16c, the controller 102 determines that the combination of the signals is in condition 2b. The system and process 1800 therefore proceeds to the process block 1809 where the controller 102 determines that the impedance of the N FET/resistor pair network needs to increase. Since the N FET/resistor pair network is currently configured in Impedance Sequence 2 (i.e., FET 110b switched ON, FET 110c switched ON, and FET 110d switched OFF), the controller 102 determines from Table 17b that an increase in impedance will result in the N FET/resistor pair network configured in Impedance Sequence 1. Consequently, the controller 102 switches OFF the FET 110c via the control line 121c to configured the N FET/resistor pair network into the configuration of Impedance Sequence 1. The system and process 1800 then proceeds to the process block 1811 and enters the optional wait state equal to the maximum propagation delay as previously described herein.

Referring again to FIG. 20, the time instant $t_{12}$ shows the effect of the impedance increase, which has caused $dV_o/dt$ to change sign and the logic levels of the $dV_o/dt$ Positive and $dV_o/dt$ Negative signals to invert. The system and process 1800 proceeds to the process block 1807, where the levels of the state determination signals received from the state determination system 141 are received and read by the controller 102. In the process block 1808, the controller 102 evaluates the received signals, which in this situation have been produced by the state determination system 141 (see Tables 16a and 16b of FIG. 16) to be UCTE=1, LCTE=0, $dV_o/dt$ Positive=0, and $dV_o/dt$ Negative=1. According to Table 16c, the controller 102 determines that the combination of the signals is in condition 2c. The process block 1808 is exited by the "Neither" path, and the system and process 1800 proceeds to the process block 1812. Since the UCTE signal remains at a logic level 1, the system and process 1800 will then loop through the process blocks 1807, 1808, and back to the process block 1812 until the output voltage $V_o$ drops below the UCT (indicated in FIG. 20 at the time instant $t_{13}$), causing the UCTE signal to transition from a logic level 1 to a logic level 0 (see Table 16a). When the process block 1812 is next processed, since neither of the UCTE or LCTE signals are at a logic level 1, the system and process 1800 will exit the process block 1812 and proceed to the process block 1806 where the system and process 1800 will again wait for an interrupt.

The time instant $t_{14}$ indicates a situation when the output voltage $V_o$ falls below the LCT resulting in the LCTE signal transitioning from a logic level 0 to a logic level 1 (indicated as 1902 in FIG. 20 at the time instant $t_{14}$) resulting in an interrupt generated in the process block 1806. The system and process 1800 will then proceed to the process block 1807 where the levels of the state determination signals received from the state determination system 141 are received and read by the controller 102. In the process block 1808, the controller 102 evaluates the received signals, which in this situation have been produced by the state determination system 141 (see Tables 16a and 16b of FIG. 16) to be UCTE=0, LCTE=1, $dV_o/dt$ Positive=0, and $dV_o/dt$ Negative=1. According to Table 16c, the controller 102 determines that the combination of the signals is in condition 3c. The system and process 1800 then proceeds to the process block 1810, where it is determined that since the N FET/resistor pair network is configured in Impedance Sequence 1 according to the truth table of Table 17b, the next step in the Impedance Sequence corresponding to condition 3c is Impedance Sequence 2. To achieve this, the controller 102 maintains the FET 110b switched ON, and the controller 102 switches ON the FET 110c via the control signal 121c, and then exits the process block 1810 and proceeds to the process block 1811. In the process block 1811, an optional appropriate propagation delay time may occur.

In the process block 1807, the controller 102 reads the state determination signals received from the state determination system 141 just after the time instant $t_{15}$. In the process block 1808, the controller 102 evaluates the received signals, which in this situation have been produced by the state determination system 141 (see Tables 16a and 16b of FIG. 16) and determines that the state determination signals have remained in the configuration as they were at the time instant $t_{14}$, which is UCTE=0, LCTE=1, $dV_o/dt$ Positive=0, and $dV_o/dt$ Negative=1. According to Table 16c, the controller 102 determines that the combination of the signals remains in condition 3c. The system and process 1800 then proceeds to the process block 1810, where it is determined that since the N FET/resistor pair network is configured Impedance Sequence 2, the next step in the Impedance Sequence corresponding to condition 3c is Impedance Sequence 3. To achieve this, the controller 102 maintains the FETs 110b and 110c switched ON, and controller 102 switches ON the FET 110d via the control signal 121d. The N FET/resistor pair network is now in its lowest impedance state according to this non-liming example. The system and process 1800 then exits the process block 1810 and proceeds to the process block 1811, where it may optionally wait for one more propagation delay time interval to the time instant $t_{16}$.

After the time instant $t_{16}$ the system and process 1800 proceeds from the process block 1811 to the process block 1807 and the state determination signals produced by the state determination system 141 are received by the controller 102. In the process block 1808, the controller 102 evaluates the received signals, and determines the state determination signals to be UCTE=0, LCTE=1, $dV_o/dt$ Positive=1, and $dV_o/dt$ Negative=0. According to Table 16c, the controller 102 determines that the combination of the signals is in condition 3b. The system and process 1800 takes no impedance action and exits the process block 1808 through the path marked "Neither" and proceeds to the process block 1812, where the LCTE signal is evaluated and determined to be at a logic level 1. The system and process 1800 then continuously loops through the process blocks 1807, 1808, and back to the process block 1812 until the output voltage $V_o$ crosses above the LCT as indicated at the time instant $t_{17}$. At this point, the LCTE and UCTE signals are both at a logic level 0, and on the next pass through the process block 1812, the system and process 1800 exits to the process block 1806, where it waits for the next interrupt.

The time instant $t_{18}$ indicates a change in $dV_o/dt$, which may be attributable to an event such as an increase in the load current. Since the output voltage $V_o$ is within the range set by the UCT and LCT, no interrupt is generated in the process block 1806, and the system and process 1800 remains in the process block 1806. The time instant $t_{19}$ represents another event that may occur during operation of the system 100 when there is a decrease in the current delivered to the load 105. Since the output voltage $V_o$ is still within the range set by the UCT and LCT, no interrupt is generated in the process block 1806. The system and process 1800 remains in the process block 1806 waiting for an interrupt.

The time instant $t_{20}$ represents when the output voltage $V_o$ crosses above the UCT causing a rising edge on the UCTE signal (indicated as 1901 in FIG. 20 at the time instant $t_{20}$) resulting in the generation of an interrupt in the process block 1806. The system and process 1800 then proceeds to the process block 1807 where the levels of the state determination signals received from the state determination system 141 are received and read by the controller 102. In the process block 1808, the controller 102 evaluates the received signals, which in this situation have been produced by the state determination system 141 (see Tables 16a and 16b of FIG. 16) to be UCTE=1, LCTE=0, $dV_o/dt$ Positive=1, and $dV_o/dt$ Negative=0. According to Table 16c, the controller 102 determines that the combination of the signals is in condition 2b. The process block 1808 is exited via path 2b, and the process block 1809 is executed. In the process block 1809, the controller 102 determines that the impedance of the N FET/resistor pair network needs to increase, and since the N FET/resistor pair network is currently configured in accordance with Impedance Sequence 3, the next step in Table 17b of FIG. 17 representing an increased impedance is determined to be Impedance Sequence 2. Consequently, the controller 102 will switch OFF the FET 110d via the control line 121d to configure the N FET/resistor pair network in accordance with Impedance Sequence 2. The system and process 1800 then proceeds to the process block 1811 to enter into an optional wait state equal to the maximum propagation delay (represented as the time interval $t_{20}$ to $t_{21}$) as previously described herein.

The battery system 106 may continue to discharge the battery 108 while regulating the output voltage $V_o$ in accordance with the system and process 1800 until the battery 108 is depleted of energy and the battery system 106 shuts OFF, or until the AC power is restored and the PSU 101 returns to operation. In accordance with embodiments of the present disclosure, in such a situation, the controller 102 may be configured to incrementally increase the impedance of the N FET/resistor pair network (e.g., step-by-step in accordance with the Table 17b of FIG. 17) until all of the FETS are switched OFF. At this point, the DC-DC converter 170 may also be switched OFF. Additionally, at some point in time, charge can be restored to the battery 108 via the charger 103. In the situation where the battery 108 is depleted of energy (such as when the terminal voltage of battery 108 as sensed through the voltage sensor 147 drops to a level equal to the voltage that is at the boundary of Region 2 and Region 1 of FIG. 10), the controller 102 may be configured to turn OFF the battery system, such as by switching OFF all of the FETS in the N FET/resistor pair network, and switching OFF the DC-DC converter 170.

As described with respect to the exemplary operations of FIG. 18, the N FET/resistor pair network may be operated in accordance with a couple of terminal configurations. In one configuration, all of the FET/resistor pairs within the N FET/resistor pair network are switched OFF, resulting in no current flowing through the N FET/resistor pair network. For example, this may occur during an initial state of the system 100 when no current is being supplied to the load 105 from the battery 108 through the N FET/resistor pair network. In this case, the current from the battery 108 will be supplied only through the DC-DC converter 170, which will regulate the output voltage $V_o$ to be within the range between UCT and LCT up to the point that the current supplied to the load 105 increases to reach the Current Limit Transition Point $I_{limit(A)}$, and the output voltage of the DC-DC converter 170 droops. When the output voltage of the DC-DC converter 170 droops below the LCT, the controller 102 will decrease the impedance of the N FET/resistor pair network, and since all of the FET/resistor pairs within the N FET/resistor pair network are switched OFF, the N FET/resistor pair network has the full range of impedance reduction actions (e.g., see Tables 17a, 17b, 17c of FIG. 17) available for the controller 102. When the controller 102 needs to increase the impedance of the N FET/resistor pair network, (e.g., in response to a reduction in the required load current) and the UCTE is triggered a sufficient number of times such that all FET/resistor pairs are switched OFF, the remaining current to the load 105 can be supplied by the DC-DC converter 170, because the current to the load 105 has dropped sufficiently so that the DC-DC converter 170 can again regulate the output voltage $V_o$ without any additional conduction paths provided for the current via the N FET/resistor pair network.

In another terminal configuration, a situation may occur when all of the FET/resistor pairs within the N FET/resistor pair network are switched ON and the controller is unable to further reduce the impedance of the N FET/resistor pair network (e.g., in accordance with any one of the Impedance Sequences set forth in the Tables 17a, 17b, 17c of FIG. 17). For example, this might occur at conditions of high load currents and/or low battery states of charge, such as when the battery 108 operating point on the V-I curves exists at the lower limits of Region 2 (e.g., see FIGS. 8 and 10). In such situations, when using a linear regulator or buck converter as the DC-DC converter 170, and discharging of the battery 108 has resulted in its operating point approaching the boundary line between the Region 2 and Region 1 areas, the controller 102 may need to reduce the current supplied to the load 105 or operation of the system 100 stopped to avoid the output voltage $V_o$ dropping below the Lower Regulation Limit (e.g., see FIG. 12). If a buck-boost converter is used as the DC-DC converter 170, there may be additional options if the current supplied to the load 105 is reduced to a value below the Current Limit Transition Point. If this is done, operation of the system 100 may continue discharging of the battery 108 via the DC-DC converter 170 until the operating point of the battery 108 has reached the bottom boundary of the Region 1 area, which represents the minimum battery voltage allowed. Another situation where this may occur is a short-circuit at the load 105 or other overloads beyond the design point of the system 100, such that the battery operating point exists at current levels outside of the allowed characteristic V-I curves of the battery 108. If this situation were to occur, the system 100 may be configured to protect itself by for example, terminating all current paths between the battery 108 and the load 105 (e.g., by switching OFF all FET/resistor pairs within the N FET/resistor pair network. The DC-DC converter 170 may also be switched OFF via its control line 171, but this is not strictly necessary as the DC-DC converter 170 may be protected by its current limit characteristic.

As a result of the foregoing description, it can be readily appreciated that the system 100 can be configured to maintain an output voltage provided to a load 105 from a battery 108 within a desired range of voltages as the battery 108 is discharging, including maintaining such an output voltage within a required operating voltage range (e.g., substantially within a specified load voltage tolerance range) so as to be able to implement the system 100 as a voltage regulator (e.g., for utilization as a Battery Backup Unit or DC UPS).

Though embodiments of the present disclosure are disclosed herein as utilizing a battery as a power source (e.g., for battery backup purposes), embodiments of the present disclosure may be configured to utilize any appropriate type of power source. Correspondingly, the system 100 is suitable for utilization with any type of power source (instead of a battery) that has an unregulated output voltage (e.g., the output voltage of such a power source varies outside of a specified load voltage tolerance range for a particular distribution bus and its associated load).

As will be appreciated by one skilled in the art, aspects of the present disclosure (e.g., the system and process 1800) may be embodied as a system, method, and/or program product. Accordingly, aspects of the present disclosure (e.g., the system and process 1800) and the threshold detection and differentiator blocks shown in FIG. 14 may take the form of an entirely hardware embodiment, an entirely software embodiment (including firmware, resident software, micro-code, etc.), or embodiments combining software and hardware aspects that may all generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

It will also be noted that each block of the circuit block diagrams and/or the functionalities represented in the diagrams of FIGS. 1 and 18, and combinations of blocks in the circuit block diagrams and/or the functionalities represented in the diagrams of FIG. 14 and FIG. 15 can be implemented by special purpose hardware-based systems that perform the specified functions or acts, or combinations of special purpose hardware and computer instructions. For example, a module (e.g., the controller 102) may be implemented as a hardware circuit comprising custom VLSI circuits or gate arrays, off-the-shelf semiconductors such as logic chips, transistors, controllers, or other discrete components. A module (e.g., the controller 102) may also be implemented in programmable hardware devices such as field programmable gate arrays, programmable array logic, programmable logic devices, or the like.

Unless defined otherwise, all technical and scientific terms used herein have the same meaning as commonly understood to one of ordinary skill in the art to which the presently disclosed subject matter belongs. The terms "a" and "an" mean "one or more" when used in this application, including the claims.

As used herein, the term "about" is used to provide flexibility to a numerical range endpoint by providing that a given value may be "a little above" or "a little below" the endpoint.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, the term "and/or" and the use of the "/" character between two words when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

As used herein, the term "electrically coupled" or the term "coupled" when used for describing pathways in electrical or electronic circuitry refers to components with a conduction path for electrical energy (i.e., current) in at least one direction between the components. Current does not need to be flowing along the conduction path for the components to be coupled or electrically coupled. The components may be directly coupled with a conduction path including only low impedance wires and the like, or they may be indirectly coupled with semiconductors or higher impedance components that allow electrical energy to flow along the conduction path.

What is claimed is:

1. A method for regulating electrical power supplied to a distribution bus, comprising:
monitoring an output voltage delivered to the distribution bus, wherein the output voltage results from a delivery of current to the distribution bus by a first power source; and
delivering current from a second power source to the distribution bus via a DC-DC converter when the monitored output voltage decreases to a level equivalent to a voltage regulation setpoint of the DC-DC converter, wherein the DC-DC converter is coupled in parallel with a network of N FET/resistor pairs (where N≥1) between the second power source and the distribution bus.

2. The method as recited in claim 1, further comprising delivering current from the second power source to the distribution bus via the network of N FET/resistor pairs when the monitored output voltage decreases below a first predetermined threshold.

3. The method as recited in claim 2, wherein the N FETs within the network of N FET/resistor pairs are switched OFF when the current is being delivered by the DC-DC converter before the monitored output voltage decreases below the first predetermined threshold so that no current is delivered to the distribution bus from the second power source during a first time period previous to the monitored output voltage decreasing below the first predetermined threshold.

4. The method as recited in claim 2, wherein the current delivered to the distribution bus from the second power source is delivered in a shared manner by the DC-DC converter and the network of N FET/resistor pairs during a second time period subsequent to the monitored output voltage decreasing below the first predetermined threshold.

5. The method as recited in claim 4, wherein the delivering current from the second power source to the distribution bus via the network of N FET/resistor pairs when the monitored output voltage decreases below a first predetermined threshold comprises switching ON one or more of the N FETs within the network of N FET/resistor pairs.

6. The method as recited in claim 1, wherein the second power source is a discharging battery.

7. The method as recited in claim 6, wherein the decreasing of the monitored output voltage results from a failure of the first power source.

8. A method for regulating a delivery of electrical current from a power source to a load via a distribution bus, comprising:
monitoring a voltage supply to the distribution bus; and
maintaining the voltage within a specified load voltage tolerance range by controlling how much current is delivered to the distribution bus from the power source through each of first and second conductive paths coupled in parallel between the power source and the distribution bus, wherein the first conductive path comprises a DC-DC converter, and wherein the second conductive path comprises a network of N FET/resistor pairs coupled in parallel between the power source and the distribution bus, wherein each of the N FET/resistor pairs comprises a FET coupled in series with a resistor.

9. The method as recited in claim 8, wherein the maintaining the voltage within the specified load voltage tolerance range comprises modifying a total impedance of the network of N FET/resistor pairs by selectively switching ON and OFF each of the N FETs in accordance with a predetermined sequence.

10. The method as recited in claim 9, wherein the N resistors each have a different resistive value.

11. The method as recited in claim 9, wherein modifying the total impedance of the network of N FET/resistor pairs comprises:
decreasing the total impedance when the voltage is less than a first predetermined threshold and the voltage is decreasing over time; and
increasing the total impedance when the voltage is greater than a second predetermined threshold and the voltage is increasing over time, wherein the first and second predetermined thresholds are within the specified load voltage tolerance range.

12. A power system for providing power to a load via a distribution bus, the system comprising:
a power source;
a network of N (where N>1) transistors coupled between an output terminal of the power source and the distribution bus, wherein each of the N transistors is coupled in series with a resistor;
a DC-DC converter coupled in parallel with the network of N transistors between the output terminal of the power source and the distribution bus; and
a controller configured to selectively and independently activate/deactivate the DC-DC converter and the network of N transistors to enable the power source to power the load via the distribution bus with an output voltage level regulated as a function of activation/deactivation of the DC-DC converter and the network of N transistors.

13. The system as recited in claim 12, wherein the power source is a battery comprising one or more series-connected cells.

14. The system as recited in claim 12, wherein the controller is configured to adjust a voltage drop across the network by activating/deactivating a specific number of the N parallel-connected transistor/resistor pairs in accordance with a predetermined sequence.

15. The system as recited in claim 14, wherein the output voltage level is regulated to be within a specified load voltage tolerance range.

16. The system as recited in claim 15, further comprising a state determination system comprising:
a differentiator configured to determine whether the output voltage level is increasing or decreasing over time; and
a threshold detector configured to determine when the output voltage level is greater than a first predetermined threshold and less than a second predetermined threshold, wherein the controller is configured to regulate the output voltage level within the specified load voltage tolerance range by selectively and independently activating/deactivating a specific number of the N parallel-connected transistor/resistor pairs in accordance with the predetermined sequence.

17. The system as recited in claim 16, wherein the controller comprises:
circuitry configured to decrease a total impedance of the network when the output voltage level is less than the second predetermined threshold and the output voltage level is decreasing over time; and
circuitry configured to increase the total impedance when the output voltage level is greater than the first predetermined threshold and the output voltage level is increasing over time.

18. The system as recited in claim 12, wherein the DC-DC converter coupled in parallel with the network of N transistors is configured to process less than or equal to about 30% of the maximum output power of the power source.

* * * * *